(12) United States Patent
Nagai et al.

(10) Patent No.: US 8,034,674 B2
(45) Date of Patent: Oct. 11, 2011

(54) SEMICONDUCTOR DEVICE, METHOD FOR MANUFACTURING SEMICONDUCTOR DEVICE, AND ELECTRONIC APPLIANCE

(75) Inventors: Masaharu Nagai, Kanagawa (JP); Takafumi Mizoguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 653 days.

(21) Appl. No.: 12/163,227

(22) Filed: Jun. 27, 2008

(65) Prior Publication Data

US 2009/0001467 A1    Jan. 1, 2009

(30) Foreign Application Priority Data

Jun. 29, 2007   (JP) .................................. 2007-172646

(51) Int. Cl.
 *H01L 21/00* (2006.01)
(52) U.S. Cl. .................... 438/157; 438/176; 438/283
(58) Field of Classification Search .................. 438/157, 438/176, 283
See application file for complete search history.

(56) References Cited

U.S. PATENT DOCUMENTS

| | | | |
|---|---|---|---|
| 5,498,904 A | 3/1996 | Harata et al. | |
| 6,653,657 B2 | 11/2003 | Kawasaki et al. | |
| 6,812,491 B2 | 11/2004 | Kato et al. | |
| 6,841,434 B2 | 1/2005 | Miyairi et al. | |
| 6,841,797 B2 | 1/2005 | Isobe et al. | |
| 6,847,050 B2 | 1/2005 | Yamazaki et al. | |
| 6,875,998 B2 | 4/2005 | Kato et al. | |
| 6,884,668 B2 | 4/2005 | Yamazaki et al. | |
| 6,906,343 B2 | 6/2005 | Yamazaki | |
| 6,930,326 B2 | 8/2005 | Kato et al. | |
| 6,933,527 B2 | 8/2005 | Isobe et al. | |
| 6,982,194 B2 | 1/2006 | Tsunoda et al. | |
| 7,122,409 B2 | 10/2006 | Kawasaki et al. | |
| 7,189,997 B2 | 3/2007 | Tsunoda et al. | |
| 7,226,817 B2 | 6/2007 | Tanada et al. | |
| 7,259,045 B2 | 8/2007 | Dejima | |
| 7,312,473 B2 | 12/2007 | Koyama et al. | |
| 7,709,895 B2 | 5/2010 | Yamazaki et al. | |
| 2003/0209710 A1 | 11/2003 | Yamazaki et al. | |
| 2003/0218171 A1 | 11/2003 | Isobe et al. | |
| 2004/0026696 A1 | 2/2004 | Yamazaki et al. | |
| 2006/0214239 A1* | 9/2006 | Shimada ...................... 257/401 |
| 2007/0257262 A1 | 11/2007 | Dejima | |

FOREIGN PATENT DOCUMENTS

| | | |
|---|---|---|
| JP | 05-110099 | 4/1993 |
| JP | 05-198594 | 8/1993 |
| JP | 07-288227 | 10/1995 |
| JP | 2001-230420 | 8/2001 |
| JP | 2002-359376 | 12/2002 |
| JP | 2004-281687 | 10/2004 |

\* cited by examiner

*Primary Examiner* — Matthew Smith
*Assistant Examiner* — Jae Lee
(74) *Attorney, Agent, or Firm* — Nixon Peabody LLP; Jeffrey L. Costellia

(57) ABSTRACT

To provide a semiconductor device in which a channel formation region can be thinned without adversely affecting a source region and a drain region through a simple process and a method for manufacturing the semiconductor device. In the method for manufacturing a semiconductor device, a semiconductor film, having a thickness smaller than a height of a projection of a substrate, is formed over a surface of the substrate having the projections; the semiconductor film is etched to have an island shape with a resist used as a mask; the resist is etched to expose a portion of the semiconductor film which covers a top surface of the projection; and the exposed portion of the semiconductor film is etched to be thin, while the adjacent portions of the semiconductor film on both sides of the projection remain covered with the resist.

21 Claims, 15 Drawing Sheets

SEMICONDUCTOR DEVICE, METHOD FOR MANUFACTURING SEMICONDUCTOR DEVICE, AND ELECTRONIC APPLIANCE

BACKGROUND OF THE INVENTION

1. Field of the Invention

The present invention relates to a semiconductor device and a method for manufacturing the semiconductor device. In particular, the present invention relates to a semiconductor device in which a channel formation region has a smaller thickness than each of a source region and a drain region, and a method for manufacturing the semiconductor device. More specifically, the present invention relates to a semiconductor device in which a channel formation region has a smaller thickness than each of a source region and a drain region and a lightly doped drain (hereinafter referred to as LDD) region is provided between the channel formation region and the drain region, and a method for manufacturing the semiconductor device. The present invention also relates to an electronic appliance using the semiconductor device.

2. Description of the Related Art

It is known that in a thin film transistor (hereinafter referred to as a TFT), a subthreshold swing showing switching characteristics (subthreshold characteristics) of the transistor can be reduced by reducing the thickness of a channel formation region. Here, a subthreshold swing is a gate voltage necessary for increasing a current (subthreshold current) between a source electrode and a drain electrode by one digit, and the smaller a subthreshold swing is, the steeper the slope of the subthreshold current with respect to the gate voltage is and the more excellent the switching characteristics are. By using such a TFT of which a subthreshold swing is small, advantages such as reduction in an off leakage current and suppression of power consumption due to reduction in an operating voltage can be obtained. However, if a whole semiconductor film in which a channel formation region is formed is thinned in order to thin the channel formation region, a source region and a drain region are also thinned; thus, there occur problems such as an increase of sheet resistance in a source region and a drain region and an increase of contact resistance at interfaces between the source region and the source electrode and between the drain region and the drain electrode. Therefore, it is preferable that the thickness of the channel formation region be reduced while the thicknesses of the source region and the drain region are maintained.

Patent Document 1 (Japanese Published Patent Application No. H5-110099) discloses an example of such a technique of thinning only a channel formation region. According to the technique disclosed in Patent Document 1, a channel formation region is thinned as follows. First, a projection is formed at a portion corresponding to a channel formation region over an insulating substrate. A surface of the insulating substrate is partially etched to be removed so that such a projection can be formed. A semiconductor layer formed of silicon or the like is deposited on the insulating substrate including the projection to a given thickness so that a portion corresponding to the projection of the semiconductor layer is raised, and then, an insulating film having a plane surface is formed over the semiconductor layer Next, a photoresist film is formed over the insulating film in a position corresponding to the projection and ions are injected into the semiconductor layer with the photoresist film used as a mask so that a source region and a drain region are formed in semiconductor layers of both sides of the projection and after that, the photoresist film is removed. Thus, an upper layer portion of the raised portion (that is, the channel formation region) of the semiconductor layer is etched to be removed together with the insulating film to planarize the surface of the semiconductor layer, so that the channel formation region is thinned. The insulating film and the semiconductor layer are etched by plasma etching in a mixed gas atmosphere of $SF_6$ and $CHF_3$. With the technique disclosed in Patent Document 1, when the raised portion of the semiconductor layer, which corresponds to the projection of a surface of an insulator, is thinned, etching is performed until an entire surface of the semiconductor layer is exposed and planarized. Therefore, the source region and the drain region might also be etched together with the raised portion (channel formation region). Further, because plasma etching is used, deterioration of characteristics might occur; for example, an upper portion of the semiconductor layer might be damaged or made to be amorphous and thus, resistance might be increased.

Patent Document 2 (Japanese Published Patent Application No. 2004-281687) discloses another technique of thinning a channel formation region. According to Patent Document 2, a photosensitive resist provided over a semiconductor layer (operation layer) is exposed to light with the use of a halftone mask so that part of the photosensitive resist, which is over the channel formation region in a TFT formation region, is thinner than part of the photosensitive resist, which is over a region other than the channel formation region. Then, the photosensitive resist is further processed so that part of the photosensitive resist, which is over the channel formation region, is removed, and wet etching or dry etching is performed using the remaining part of the photosensitive resist as a mask to thin the channel formation region. However, such selective light exposure of the photosensitive resist with the use of a halftone mask complicates a process and can lead to an increase in manufacturing cost.

On the other hand, a TFT having an LDD structure is known, in which a low concentration impurity region (or an LDD region) is formed between a channel formation region and a drain region and/or between a channel formation region and a source region in order to reduce an off current of the TFT and prevent deterioration of the TFT due to hot carriers. A source region and a drain region are doped with impurities in two steps so that such an LDD region can be formed. More specifically, light doping is performed using a gate electrode as a mask first. Then, a sidewall (for example, silicon oxide) is formed on a side surface of the gate electrode and heavy doping is performed using the gate electrode and the sidewall as masks, so that part of a semiconductor layer, which is located under the sidewall, can be an LDD region. However, in the case where the sidewall is formed in order to the LDD region, steps of manufacturing the TFT are increased. Further, since the sidewall and a gate insulating film are normally formed of the same material as a main component, such a problem might occur that the gate insulating film is also etched at the same time by etching for formation of the sidewall, which undesirably thin the gate insulating film and generate a leakage current. Further, because the LDD region is provided, there occurs a problem that the size (area) of the TFT is increased and thus integration is reduced.

Patent Document 3 (Japanese Published Patent Application No. H5-198594) discloses an example of a technique by which an LDD region can be formed without providing a sidewall and the size of an element can be prevented from being increased. According to Patent Document 3, a light-shielding layer is formed over a quartz substrate with a given space between the light-shielding layer and the quartz substrate and a polycrystalline silicon layer is formed over the quartz substrate and the light-shielding layer, so that a semiconductor layer having an uneven shape is formed. Then, a gate insulating film and a gate electrode are sequentially formed over the semiconductor layer. Then, a resist is applied onto the gate electrode and a rear surface of the quartz substrate is exposed to light by using the light-shielding layer as a mask so that only a region of the resist, in which the light-shielding layer does not exist, remains. Next, the gate electrode and the gate insulating film are etched using the remaining part of the resist as a mask to remove unnecessary parts of the gate electrode and the gate insulating film, and the gate electrode is formed over the semiconductor layer of a depression in an upper portion of the quartz substrate with the gate insulating film interposed therebetween. Then, the gate electrode is used as a mask to introduce impurities into the semiconductor layer by an ion shower method. In that case, two kinds of ion introduction, that is to say, ion introduction at high concentration and a shallow depth and ion introduction at low concentration and a deep depth are performed. Accordingly, impurities are injected at high concentration into the semiconductor layer (the source region and the drain region) of a projected portion over the light-shielding layer. Further, concentration gradient is formed such that the concentration of injected impurities gradually decreases in a depth direction from a surface, in a step portion which connects the semiconductor layer (the channel formation region) of the depressed portion and the semiconductor layer (the source region and the drain region) of the projected portion below the gate electrode; and consequently, the step portion becomes an LDD region.

However, in the case of the semiconductor device and a method for manufacturing the semiconductor device, which are disclosed in Patent Document 3, the channel formation region is formed in the depressed portion of the semiconductor layer, and the source region and the drain region are formed in the projected portions of the semiconductor layer, so that the source region and the drain region are located higher than the channel formation region. Therefore, it is difficult to thin only the channel formation region without adversely affecting the source region and the drain region.

Patent Document 4 (Japanese Published Patent Application No. 2001-230420) discloses that an island-shaped insulating film excellent in thermal conductivity is formed in a predetermined region of a substrate for the purpose of controlling the position and the size of a crystal grain in a semiconductor film by suitably controlling temperature rise in irradiating the semiconductor film with a laser beam for formation of a TFT, so that a step region (projected region) of the semiconductor film, which is located over the island-shaped insulating film, is a channel formation region. Further, Patent Document 5 (Japanese Published Patent Application No. 2002-359376) discloses a dual-gate TFT provided with gate electrodes over and under a channel formation region. Patent Document 6 (Japanese Published Patent Application No. H7-288227) discloses that a number of projections and depressions are formed on a surface of a substrate and a polycrystalline semiconductor film is formed thereover.

SUMMARY OF THE INVENTION

A first object of the present invention is to provide a semiconductor device in which a channel formation region can be thinned through a simple process without adversely affecting a source region and a drain region and a method for manufacturing the semiconductor device.

A second object of the present invention is to provide a semiconductor device in which a channel formation region can be thinned and an LDD region can be formed through a simple process without adversely affecting a source region and a drain region and a method for manufacturing the semiconductor device.

According to one aspect of the present invention, a method for manufacturing a semiconductor device is offered in order to achieve the above objects. The method for manufacturing a semiconductor device includes a step of forming a substrate having a surface provided with a projection; a step of forming a semiconductor film, having a thickness smaller than a height of the projection, over the surface of the substrate which is provided with the projection; a step of forming a resist over part of the semiconductor film which covers the projection and regions adjacent to both sides of the projection of the substrate; a step of etching the semiconductor film with the resist used as a mask to form island-shaped semiconductor film covering the projection and regions adjacent to both sides of the projection of the substrate; a step of etching the resist to expose a part of the semiconductor film which covers a top surface of the projection of the substrate, while parts of the semiconductor film which are located over the regions adjacent to both sides of the projection of the substrate, remain covered with the resist; a step of etching the exposed part of the semiconductor film, which covers the top surface of the projection, to thin the exposed part of the semiconductor film; a step of removing the resist; a step of introducing impurities into the portions of the semiconductor film which are over the regions adjacent to both sides of the projection to form a source region and a drain region; and a step of forming a gate electrode close to the part of the semiconductor film which covers the top surface of the projection, with an insulating film interposed therebetween, to make the part of the semiconductor film which covers the top surface of the projection, serve as a channel formation region. Note that the substrate may be manufactured by various methods as long as it is manufactured to have a surface which is provided with a projection and has an insulating property so that a semiconductor film can be formed thereover.

According to such a method for manufacturing a semiconductor device of the present invention as described above, a semiconductor film having a thickness smaller than a height of a projection of an insulating substrate is formed on a surface of the insulating substrate; the semiconductor film is etched to have an island shape with a resist used as a mask; the resist is etched to expose a part of the semiconductor film which covers a top surface of the projection; and the exposed part of the semiconductor film is etched to be thinned while parts of the semiconductor film which cover portions adjacent to both sides of the projection are covered with the resist, so that the part of the semiconductor film which is on the top surface of the projection and a part to be a channel formation region is thinned, and regions adjacent to both sides of the projection which are to be the source region and the drain region, can be prevented from being undesirably thinned. Therefore, the channel formation region can be thinned without adversely affecting the source region and the drain region and thus, a semiconductor device (TFT) of which a subthreshold swing is small, which is excellent in switching characteristics, and which is operated with a low operating voltage can be manufactured. Further, according to the above method, the channel formation region of the semiconductor film can be thinned through a simple process without using a special mask such as a halftone mask; therefore, the manufacturing cost can be reduced.

Preferably, after the step of thinning the part of the semiconductor film which covers the top surface of the projection, a step of forming an insulating film covering at least the thinned semiconductor film is further included, and the gate electrode is formed over the insulating film, impurities are introduced using the gate electrode as a mask, and in the introduction of impurities, the thickness of the insulating film and the width of the gate electrode are preferably set so that impurities are introduced into at least part of the semiconductor film, which is extended along a side surface of the projection, through the insulating film. Accordingly, the part of the semiconductor film, which is extended along the side surface of the projection of the substrate, can be an LDD region into which impurities are introduced at low concentration; therefore, the area of an element can be prevented from being increased even when the LDD region is provided. Further, the length of the LDD region may be easily adjusted by changing the height of the projection. In addition, the LDD region can be formed by one-time introduction of impurities without forming a side wall and thus the number of steps can be reduced and the yield can be improved. Because a side wall is not required to be formed, it can be prevented that in etching for formation of a side wall, the insulating film between the gate electrode and the semiconductor film is etched at the same time and thus that the insulating film is undesirably thinned and a leakage current is generated. Note that the side surface of the projection may be perpendicular to a main surface (that is, the horizontal direction) of the substrate or the projection may have a tapered shape in which side surfaces are sloping.

According to one embodiment, the step of forming an insulating substrate having a surface provided with a projection may include a step of forming a base film over a substrate having a plane surface, a step of forming an additional gate electrode over the base film, and a step of forming an insulating film covering the additional gate electrode. Accordingly, a semiconductor device having a dual-gate structure can be formed. The dual-gate structure gives an effect the same as that obtained by reducing the thickness of the semiconductor film by half, so that a subthreshold swing can be further reduced. Further, variation of a threshold voltage of the semiconductor device can be reduced and an off current can also be reduced. By reducing a subthreshold swing, a semiconductor device can be operated with a low threshold voltage. Therefore, a power source voltage is reduced with an operation speed of the semiconductor device maintained, so that power consumption can be suppressed.

According to another embodiment, the step of forming an insulating substrate having a surface provided with a projection may include a step of forming a base film over a substrate having a plane surface, a step of forming the gate electrode over the base film, and a step of forming an insulating film covering the gate electrode. Accordingly, a semiconductor device having a bottom-gate structure can be formed.

In the case of a semiconductor device having a bottom-gate structure, the abovementioned method includes, after the step of thinning the part of the semiconductor film, which covers the top surface of the projection, a step of forming an insulating film covering at least the thinned part of the semiconductor film and a step of forming a resist over the insulating film, and impurities are introduced using the resist over the insulating film as a mask and in the introduction of impurities, the thickness of the insulating film and the width of the resist can be set so that impurities are introduced into at least part of the semiconductor film, which is extended along a side surface of the projection, through the insulating film. In that case, part of the semiconductor film, which is extended along the side surface of the projection of the substrate, can be an LDD region into which impurities are introduced at low concentration; therefore, the area of an element can be prevented from being increased even when the LDD region is provided. Note that such introduction of impurities with the use of a resist as a mask can be applied not only to the case of a bottom-gate structure and but also to the case (top-gate structure) where a gate electrode is formed above part of a semiconductor film, which covers a projection.

In the case of a semiconductor device having a bottom-gate structure, when the step of forming the resist over the insulating film includes a step of performing rear surface light exposure on the resist deposited on the insulating film with the use of the gate electrode formed in the projection as a mask, and a step of removing the light-exposed part of the resist, a mask for patterning a resist is not additionally required; therefore, a manufacturing process can be simplified and the cost can be reduced.

According to another aspect of the present invention, a semiconductor device is provided which includes an insulating substrate having a surface provided with a projection; a island-like semiconductor film which covers the projection and regions adjacent to both sides of the projection of the insulating substrate and which has a thickness smaller than the height of the projection; a gate electrode provided close to part of the semiconductor film, which covers a top surface of the projection of the substrate, with an insulating film interposed therebetween; and a source region and a drain region which are formed by introducting impurities into parts of the semiconductor film, which cover the regions adjacent to both sides of the projection of the substrate, wherein the part of the semiconductor film, which covers the top surface of the projection of the substrate, is thinner than each of the parts of the semiconductor film, which cover the regions adjacent to both sides of the projection of the substrate.

Thus, the part of the semiconductor film, which covers the top surface of the projection of the substrate, which is provided close to the gate electrode and functions as a channel formation region, is thinner than each of the source region and the drain region which cover the regions adjacent to both sides of the projection of the substrate, so that a subthreshold swing is reduced and thus a semiconductor device excellent in switching characteristics can be achieved. Further, the thickness of the semiconductor film formed over the insulating substrate provided with a projection is smaller than the height of the projection, so that the parts of the semiconductor film, which cover the regions adjacent to both sides of the projection, are located lower than the top surface of the projection. Therefore, when the part of the semiconductor film, which covers the top surface of the projection (that is, the channel formation region), is thinned, the parts of the semiconductor film, which cover the regions adjacent to both sides of the projection (that is, the source region and the drain region) can be easily covered with a resist. Therefore, the semiconductor device in which only the channel formation region is thinned without adversely affecting (that is, without undesirably thinning) the source region and the drain region can be achieved.

Preferably, the semiconductor device of the present invention has an LDD region into which impurities are introduced at lower concentration than those of the source region and the drain region in at least part of the semiconductor film, which is extended along a side surface of the projection. Thus, the part of the semiconductor film, which is extended along a side surface of the projection, is an LDD region. The LDD region is provided without increasing the area of an element, so that reliability of the semiconductor device can be improved. Further, the length of the LDD region can be easily adjusted by changing the height of the projection.

The gate electrode may be provided above the top surface of the projection or inside the projection (bottom-gate structure) or may be provided above the top surface of the projection and inside the projection (dual-gate structure).

Further, the semiconductor device according to the present invention can be used for various electronic appliances. For example, the semiconductor device can be used as a pixel transistor of a liquid crystal display device or a switching TFT of a peripheral driver circuit of an electronic appliance. Accordingly, reduction in power consumption due to reduction in operating voltage and high reliability can be achieved without increase in size of the appliance.

By the method for manufacturing a semiconductor device, according to the present invention, a channel formation region can be thinned without adversely affecting a source region or a drain region, so that a semiconductor device (TFT) of which a subthreshold swing is small, which has excellent switching characteristics, and which is operated with a low operating voltage can be manufactured. Further, since the channel formation region of the semiconductor film can be thinned through a simple process without using a particular mask such as a halftone mask, the manufacturing cost can be suppressed.

Further, according to the present invention, a semiconductor device in which only a channel formation region is thinned without adversely affecting (that is, without undesirably thinning) a source region and a drain region can be achieved.

DETAILED DESCRIPTION OF THE INVENTION

FIGS. 1A to 1J are cross-sectional views showing a method for manufacturing a semiconductor device (TFT), according to a preferred embodiment of the present invention.

Figure 1A:
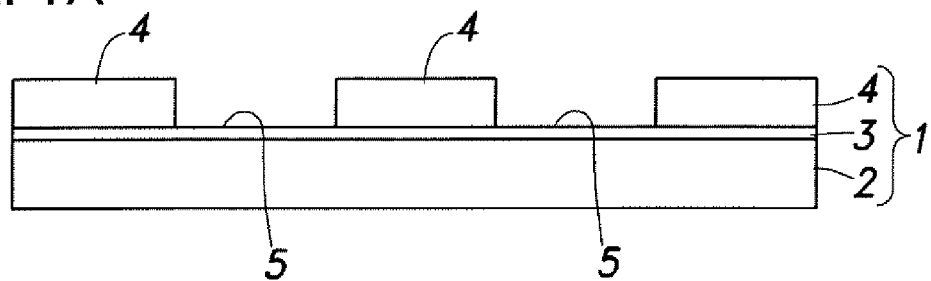
FIGS. 1A to 1J are cross-sectional views showing an embodiment of a method for manufacturing a semiconductor device, according to the present invention.

First, as shown in FIG. 1A, an insulating substrate 1 having a surface provided with a projection is formed. In FIG. 1A, three projections 4 are formed and each of depressed portions 5 is formed between the projections 4 adjacent to each other. That is, the depressed portions 5 are located adjacent to both sides of the central projection 4. The insulating substrate 1 provided with the projections 4 can be formed by, for example, forming a base film (insulating film) 3 on a top surface of a substrate 2 having a plane surface and forming a material serving as the projections 4 over the base film 3. As the substrate 2 having a plane surface, a glass substrate, a quartz substrate, a silicon single crystal substrate, a metal substrate, a plastic substrate having heat resistance, or the like can be used. The insulating substrate 1 only needs to have an insulating surface (including the surface of the projection 4) and is not required to be wholly formed of an insulating material.

The base film 3 only needs to have heat resistance and chemical resistance which are required in a subsequent film formation process and may be an insulating material. As the base film 3, silicon nitride ($SiN_x$), silicon oxynitride ($SiO_xN_y$), silicon oxide ($SiO_x$), or the like can be used. They can be preferably formed by, for example, a CVD method (chemical vapor deposition method). The base film 3 may be a layered film including not a single layer but a plurality of layers. For example, in the case where a semiconductor layer in which a source region and a drain region are formed is formed of polycrystalline silicon, polycrystalline silicon and silicon nitride have bad compatibility; therefore, it is preferable that after a silicon nitride film is formed on a surface of the substrate, a silicon oxide film be formed thereover and a polycrystalline silicon film be formed over the silicon oxide film. It is preferable that a thickness of the base film be normally from 30 to 300 nm. Note that formation of the base film 3 can be omitted depending on the kind of the substrate 2 having a plane surface, such as a quartz substrate with which there is no concern that impurities enter a semiconductor layer.

As the material forming the projections 4, silicon nitride, silicon oxynitride, silicon oxide, or the like can be used. Any of them is formed over the base film 3 by, for example, a CVD method and then etched with a patterned photoresist (also simply referred to as resist) used as a mask, so that the projection 4 can be formed in a predetermined position. A height of the projection 4 depends on the size of a TFT to be formed (in particular, the length of the LDD region as described below) and can be, for example, from 100 nm to 1.5 μm.

Figure 1B:
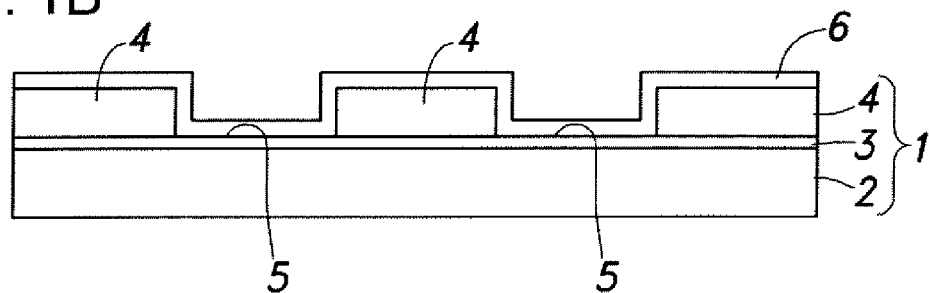

Next, as shown in FIG. 1B, a crystalline semiconductor film 6 is formed over a surface of the substrate provided with the projections 4. As the material of the semiconductor film 6, various materials can be used and, for example, polycrystalline silicon can be used. Polycrystalline silicon can be obtained by forming an amorphous silicon film by a CVD method or the like using a semiconductor material gas such as silane ($SiH_4$) and then crystallizing the amorphous silicon film by a laser crystallization method or the like. In the case of such a laser crystallization method, it is required that a laser be delivered so that the thickness of the semiconductor film 6 is not changed and the semiconductor film 6 is not entirely melted but partially melted or unmelted. As a laser suitable for a laser crystallization method, a pulsed laser such as an excimer laser is preferably used. Note that the entirely melting state refers to a state in which the semiconductor film 6 from the top surface to the bottom surface is melted so that a melted portion is liquid. The partially melting state refers to a state in which part of the semiconductor film 6 between the top surface and a certain thickness is melted and a bottom surface portion is mainly solid. In the case where the substrate has high heat resistance like in the case where a quartz substrate is used as the substrate 2, a thermal crystallization method may be used instead of a laser crystallization method. Alternatively, solid-phase growth using a catalytic element for promoting crystallization, such as Ni, may be performed. A thickness of the semiconductor film 6 is normally 50 nm or larger and is preferably smaller than the height of the projection 4 as described below.

Figure 1C:
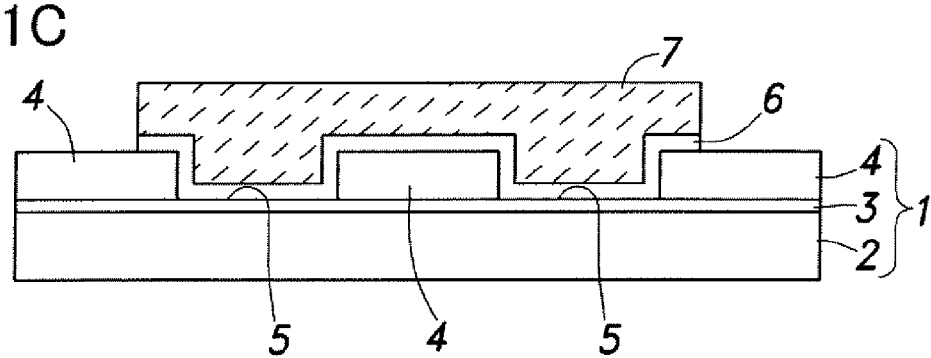

Next, as shown in FIG. 1C, a resist 7 is deposited on the semiconductor film 6 and patterned using a light-exposure apparatus or the like so that the resist 7 is formed over only part of the semiconductor film 6, which covers the projections 4 and regions (the depressed portions 5 in this embodiment) adjacent to both sides of the projection 4 of the substrate 1, and then the semiconductor film 6 is etched with the resist 7 used as a mask so as to have an island shape. In the semiconductor film 6 having an island shape, parts covering top surfaces of the projections 4 and parts covering the regions 5 adjacent to both sides of the projection 4 continue through parts extended perpendicularly to a side surface of the projection 4.

Figure 1D:
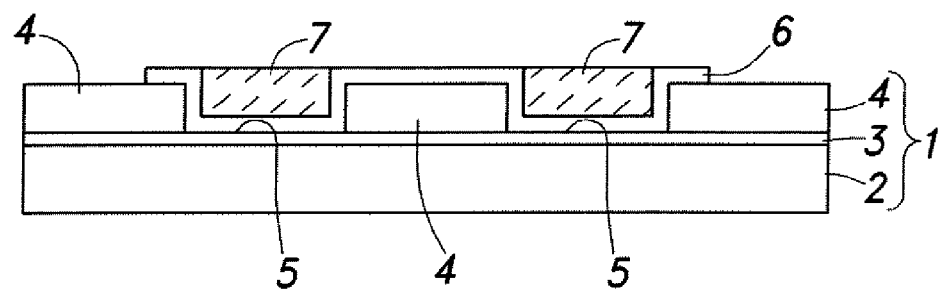

After the semiconductor film 6 having an island shape is formed, the resist 7 is etched back to expose the parts of the semiconductor film 6, which cover top surfaces of the projections 4 of the substrate 1, as shown in FIG. 1D. At that time, etching is stopped before the resist 7 in the depressed portions 5 is removed, so that parts of the semiconductor film 6, which are over the depressed portions 5 of the substrate 1, are covered with the resist 7. According to the present invention, the thickness of the semiconductor film 6 having an island shape is smaller than the height of the projection 4 of the substrate 1 and the parts of the semiconductor film 6 having an island shape, which cover the depressed portions 5 adjacent to both sides of the projection 4, are located lower than the top surfaces of the projections 4. Therefore, when the resist 7 is etched to expose parts of the semiconductor film 6, which cover the top surfaces of the projections 4, the resist 7 having sufficient thickness is left over the parts of the semiconductor film 6, which are over the depressed portions 5. Thus, it is possible to easily and reliably expose only the parts of the semiconductor film 6 that cover the top surfaces of the projections 4 of the substrate 1 while maintaining coverage of the resist over the parts of the semiconductor film 6 that are over the depressed portions 5 of the substrate 1.

Figure 1E:
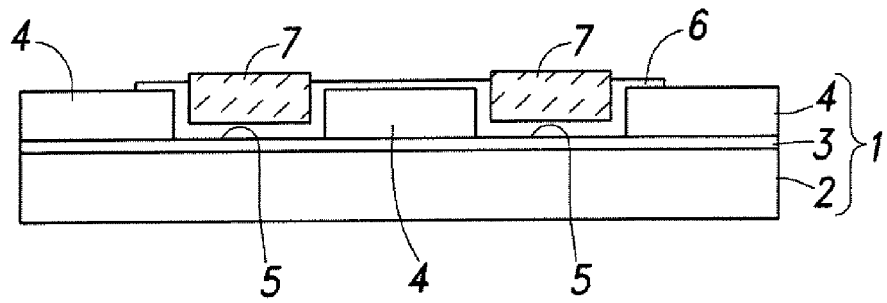

In a step shown in FIG. 1E, parts of the semiconductor film 6, which are exposed and cover the top surfaces of the projections 4 of the substrate 1, are etched to be thinned so as to each have a thickness of approximately 10 to 50 nm. In that case, the parts of the semiconductor film 6, which are over the depressed portions 5 of the substrate 1, are covered with the resist 7; therefore, there is no concern that they are undesirably thinned by being etched. Note that in the step of thinning the semiconductor film 6, it is preferable that etchback be performed by dry etching first and then a part including damage formed on its surface be removed by wet etching As described below, the thinned part of the semiconductor film 6, which is over the central projection 4, is to be a channel formation region of a TFT.

Figure 1F:
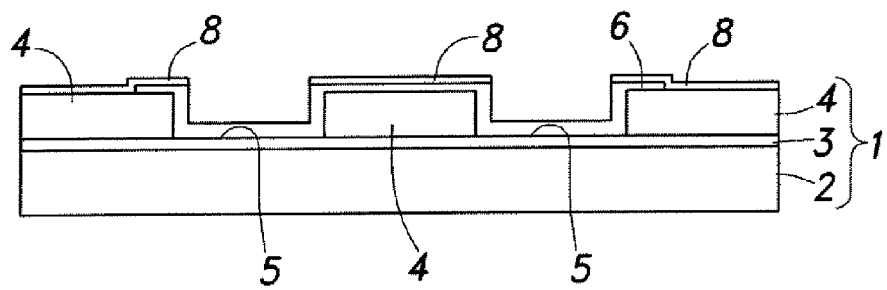

Next, as shown in FIG. 1F, the resist 7 in each of the depressed portions 5 are removed, an insulating film (gate insulating film) 8 is formed to cover the top surface of the thinned part of the semiconductor film 6, which is over the central projection 4, and parts of the insulating film 8, which are over the depressed portions 5, are removed. Consequently, the top surfaces of the parts of the semiconductor film 6, which are over the projections 4, are covered with the insulating film 8, and the surfaces of the parts of the semiconductor film 6, which are over regions (the depressed portions 5) adjacent to both sides of the central projection 4, are exposed. The insulating film 8 can be formed from a material similar to that of the base film 3, which is described above, and is preferably thin as long as a leakage current does not occur. For example, the insulating film 8 can have a thickness of approximately 1 nm. Needless to say, the insulating film 8 may be formed from an insulating material different from that of the base film 3. Note that while the insulating film 8 is formed not only over the central projection 4 having the top surface provided with part of the thinned semiconductor film 6, which serves as a channel formation region, but over the projections 4 at both ends, in each of which a channel formation region is not formed, in FIG. 1F, the insulating film 8 is allowable as long as it covers the part of the semiconductor film 6, which serves as a channel formation region, and the part of the semiconductor film 6, which serves as an LDD region, and does not necessarily cover the projections 4 (the projections 4 at both ends in FIG. 1F) in each of which a channel formation region is not formed. Alternatively, the insulating film 8 may be formed without removing the resists 7 in the depressed portions 5 and then the resists 7 may be removed.

Figure 1G:
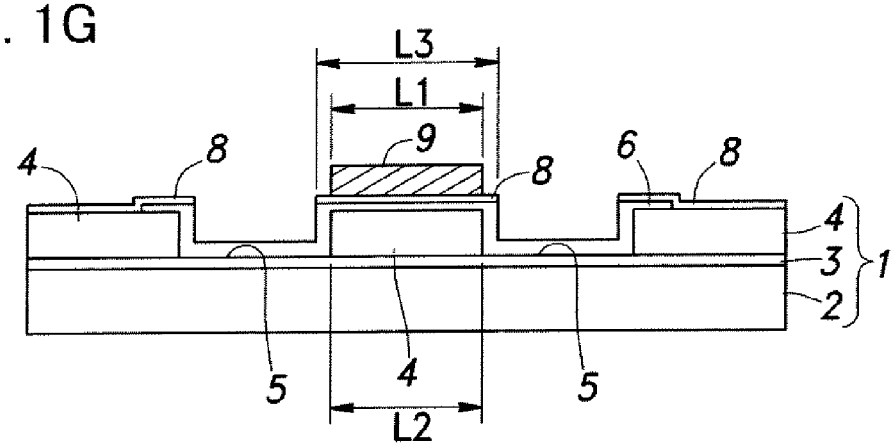

Next, as shown in FIG. 1G, a gate electrode 9 is formed over part of the insulating film 8, which covers the part of the semiconductor film 6, which is over the central projection 4. The gate electrode 9 can be formed from a conductive material. The gate electrode 9 can be formed using an element such as tantalum (Ta), tungsten (W), titanium (Ti), molybdenum (Mo), aluminum (Al), copper (Cu), chromium (Cr), or niobium (Nb) or an alloy or compound material that contains any of such elements as its main component. Alternatively, conductive crystalline silicon may be used. Further, such a material may be formed as a single layer or a laminate. In order to form the gate electrode 9, such a material is formed by a sputtering method, for example. Then, after a photoresist (not shown) is applied thereover to be patterned by light exposure and development, a film of a gate material is etched with the patterned photoresist used as a mask by dry etching, wet etching, or the like. After etching, the photoresist is removed. An ink-jet apparatus or the like may be used to pattern a photoresist instead of light exposure and development. A thickness of the gate electrode 9 is normally approximately 100 to 400 nm. Further, a dimension L1 in the channel length direction of the gate electrode 9 (that is, the dimension in the horizontal direction in the drawing) is preferably equal to a dimension L2 in the channel length direction of the projection 4 of the substrate 1, that is to say, the dimension L1 is preferably shorter than a dimension L3 in the channel length direction of the gate insulating film 8 by the thickness of part of the semiconductor film 6, which is extended perpendicularly to the side surface of the projection 4 of the substrate 1.

Figure 1H:
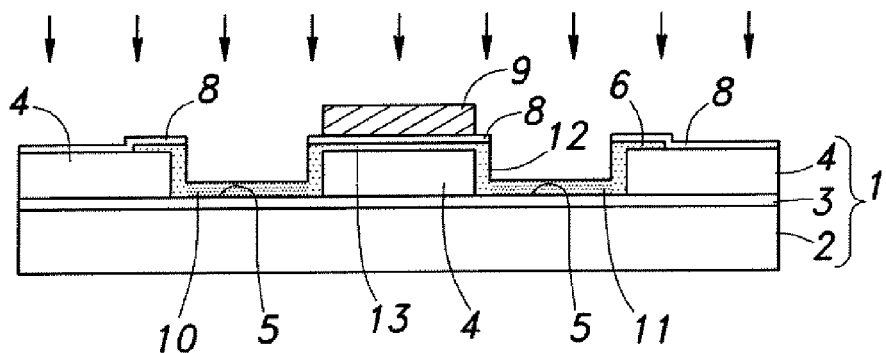
Figure 1I:
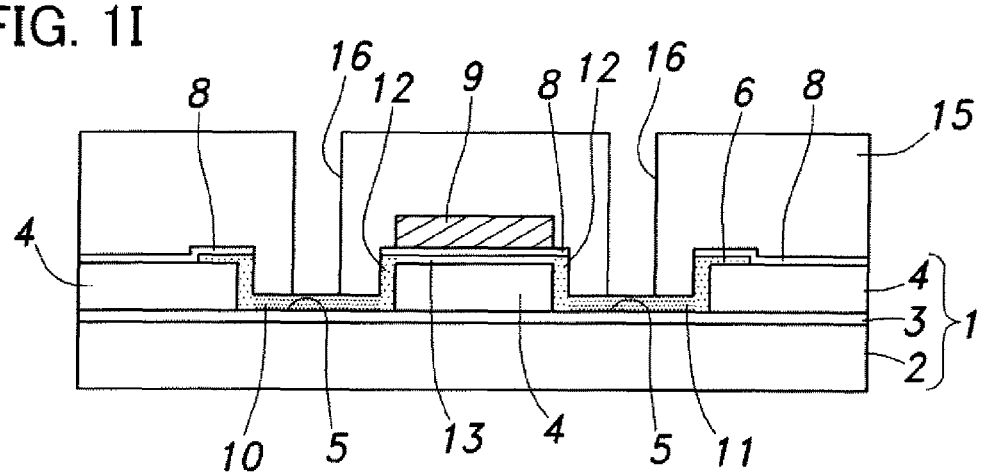

In the step shown in FIG. 1H, impurities are introduced into the semiconductor film 6 with the gate electrode 9 used as a mask by, for example, a plasma doping method or an ion implantation method. Because parts of the semiconductor film 6, which are located over the depressed portions 5 of the substrate 1, are exposed, impurities are introduced into such parts of the semiconductor film 6 at high concentration so that a source region 10 and a drain region 11 are formed. On the other hand, because impurities are introduced into parts of the semiconductor film 6, which are extended perpendicularly to the side surfaces of the central projection 4 of the substrate 1, through the insulating film 8 above the semiconductor film 6, an LDD region 12 into which impurities are introduced at low concentration is formed. No impurities are introduced into a part of the semiconductor film 6, which is below the gate electrode 9 (that is, the thinned part of semiconductor film 6), and the part is to serve as a channel formation region 13. Impurities to be introduced into the semiconductor film 6 are materials suitable for desired conductivity. As the impurity element imparting N-type conductivity, an element belonging to Group 15, such as phosphorus (P) or arsenic (As), may be used. As the impurity element imparting P-type conductivity, boron (B) is generally used. Note that an ultrathin oxide film such as a natural oxide film may be formed on surfaces of the parts of the semiconductor film 6, which are located over the depressed portions 5 of the substrate 1, as long as impurities can be introduced into the parts of the semiconductor film 6 at sufficient concentration.

Next, as shown in FIG. 11, after an interlayer insulating film 15 is formed on a surface, openings (contact holes) 16 which reach parts (the source region 10 and the drain region 11) of the semiconductor film 6, which are over the depressed portions 5 of the substrate 1, are formed by etching, for example. The interlayer insulating film 15 can be formed using a material similar to that of the base film 3, the gate insulating film 8, or the like. Alternatively, the interlayer film 15 may be formed using an organic material (such as polyimide or polyamide) by a droplet discharge method (inkjet method) or a spin coating method. Using a spin coating method has an advantage that a surface of the interlayer insulating film 15 can be easily planarized. It is also possible that an inorganic material is deposited as the interlayer insulating film 15 by a CVD method and then the surface of the interlayer insulating film 15 is planarized by a CMP method (chemical mechanical polishing method). Alternatively, the interlayer insulating film 15 may be provided by stacking an inorganic material and an organic material. When a droplet discharging method is used, the openings 16 can be directly formed; therefore, a separate step of forming the openings 16 can be omitted. A thickness of the interlayer insulating film 15 is generally approximately 750 nm to 3 μm.

Figure 1J:
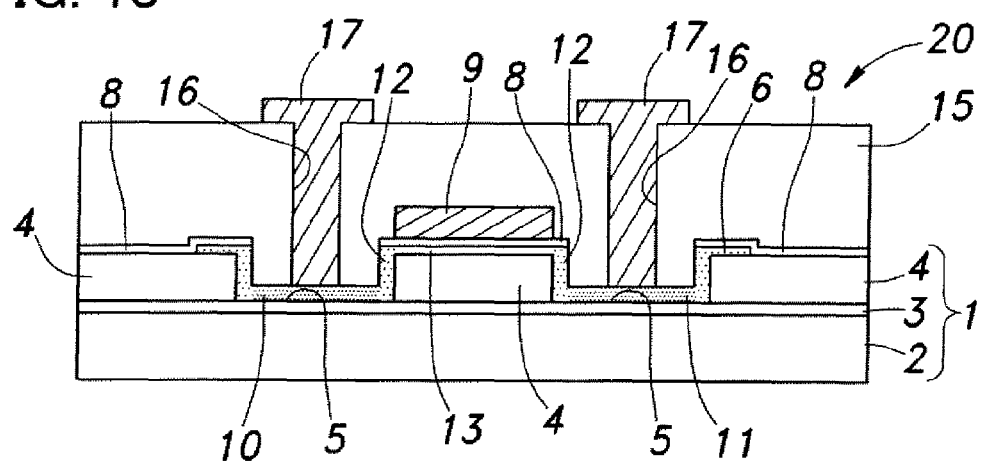

Then, as shown in FIG. 1J, a conductive layer 17 serving as a wiring, which is connected to the source region 10 and the drain region 11, is formed so that a TFT 20 is obtained. Any material can be used for the conductive layer 17 as long as it has conductivity. For example, the material of the gate electrode 9, which is described above, is deposited by a sputtering method and patterned as appropriate, so that the conductive layer 17 can be formed.

Thus, according to a preferred embodiment of the present invention, the semiconductor film 6 having a thickness smaller than the height of the projection 4 is formed on a surface of the insulating substrate 1 provided with the projections 4, so that part of the semiconductor film 6, which serves as the channel formation region 13, is provided on top surfaces of the projections 4 of the insulating substrate 1, and parts of the semiconductor film 6, which serve as the source region 10 and the drain region 11, are provided over the regions 5 adjacent to both sides of the projection 4 of the insulating substrate 1, and the part of the semiconductor film 6, which serves as the channel formation region 13, is thinned so that the parts of the semiconductor film 6, which serve as the source region 10 and the drain region 11, are covered with the resist 7. Therefore, the part of the semiconductor film 6 which serves as the channel formation region 13 can be thinned without undesirably thinning the parts of the semiconductor film 6 which serve as the source region 10 and the drain region 11, thus a semiconductor device (TFT) 20 of which a subthreshold swing is small, which has an excellent switching characteristic, and which is operated with low operating voltage can be manufactured. Further, the channel formation region 13 of the semiconductor film 6 can be thinned through a simple process without using a special mask such as a halftone mask; therefore, the manufacturing cost can be reduced.

Further, the sizes of the gate electrode 9 and the gate insulating film 8 isolating the semiconductor film 6 from the gate electrode 9 are set so that impurities are introduced into at least the parts of the semiconductor film 6 which are extended along the side surfaces of the projection 4 of the substrate 1 through the insulating film 8 in introduction of impurities into the semiconductor film 6 with the gate electrode 9 used as a mask. Therefore, the parts of the semiconductor film 6, which are extended along the side surfaces of the projection 4, can be the LDD regions 12. Accordingly, even when the LDD regions 12 are provided, the area of the TFT 20 is not increased; therefore, the TFT 20 which is small and highly reliable can be achieved. Further, the length of the LDD region 12 may be easily adjusted by changing the height of the projection 4. In addition, the LDD region 12 can be formed by one-time introduction of impurities without forming a side wall and thus the number of steps can be reduced and the yield can be improved. Since a side wall is not required to be formed, problems such as undesirable thinning of the gate insulating film 8 and generation of a leakage current, which are caused by etching the gate insulating film 8 at the same time in etching to form the side wall, can be prevented. Further, a mask is not required to be additionally provided because impurities are introduced using the gate electrode as a mask; therefore, the process can be simplified.

Figure 2A:
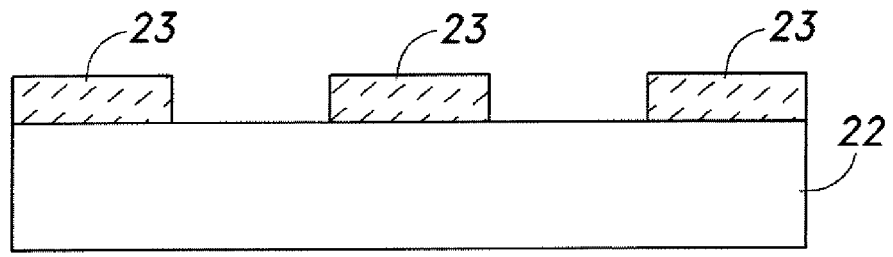
FIGS. 2A to 2C are cross-sectional views showing an embodiment of a method for forming an insulating substrate having a surface provided with a projection.
Figure 2B:
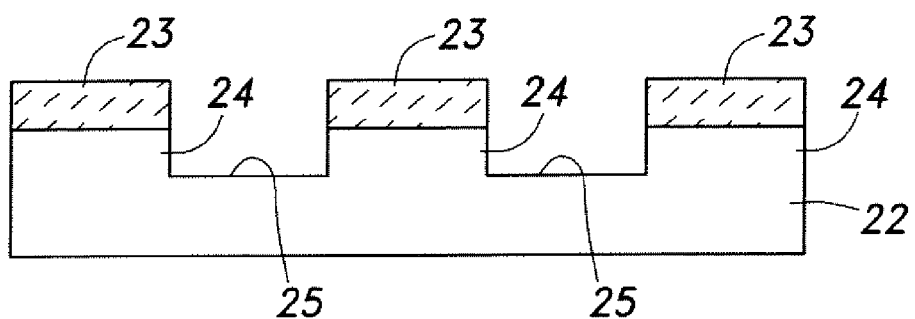
Figure 2C:
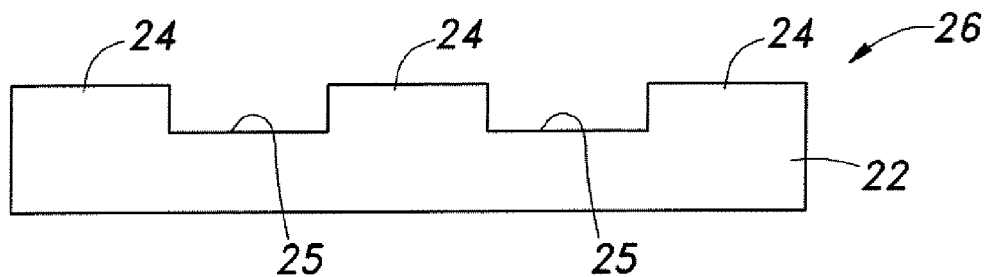

In embodiments of FIGS. 1A to 1J, the insulating substrate 1 provided with the projections 4 is formed by forming the base film (insulating film) 3 on the plane top surface of the substrate 2 and depositing a material serving as the projections 4 over the base film 3. However, an insulating substrate provided with projections may be formed by another method. FIGS. 2A to 2C are cross-sectional views showing another method for forming an insulating substrate provided with projections.

As shown in FIG. 2A, a resist 23 is applied over the substrate 22 formed from an insulating material having a plane surface first and then the resist 23 is patterned to be left over a region in which a projection is to be formed. Next, as shown in FIG. 2B, when the substrate 22 is etched using the resist 23 as a mask to form a depressed portion 25, a projection 24 is formed adjacent to the depressed portion 25. Then, the resist 23 is removed as shown in FIG. 2C. Thus, an insulating substrate 26 having a surface provided with the projections 24 can be formed. As the substrate 22 suitable for a method for manufacturing the projection 24, for example, a glass substrate, a quartz substrate, and a silicon substrate are given. Note that in the case of using a glass substrate, because impurities (for example, alkali metal such as Na) in glass, which come out by etching, might enter a semiconductor film to be formed in a subsequent step, it is required to carefully wash the substrate after the processing. Further, a base film may be formed over a surface of the substrate 26 provided with projections, which is formed through the steps of FIGS. 2A to 2C. Thus, an insulating substrate having a surface provided with projections can be formed by various methods.

Figure 3:
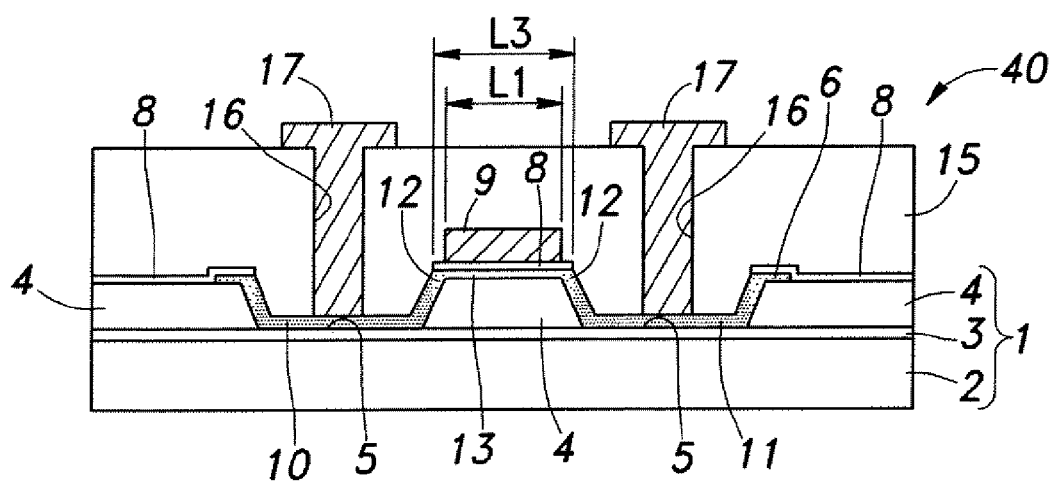
FIG. 3 is a cross-sectional view showing an embodiment of a semiconductor device according to the present invention.

FIG. 3 is a cross-sectional view showing a modified embodiment of the TFT 20 shown in FIG. 1J. The TFT 20 in FIG. 1J has the projection 4 on the surface of the insulating substrate, which has a side surface perpendicular to a surface of the substrate, whereas a TFT 40 in FIG. 3 is different from the TFT 20 in that the projections 4 have tapered shapes in which the side surfaces are sloping. The TFT 40 in FIG. 3 can be manufactured through a process similar to that shown in FIGS. 1A to 1J except that when the projections 4 on the surface of the substrate are formed, etching or the like is performed so that the side surfaces of the projections 4 are sloping. Therefore, the channel formation region 13 can be thinned without a concern that the thicknesses of the source region 10 and the drain region 11 are undesirably reduced, and thus transistor characteristics can be improved. Further, also in the TFT 40 in FIG. 3, since the dimension L1 in the channel length direction of the gate electrode 9 is shorter than the dimension L3 in the channel length direction of the insulating film 8 covering the top surface of the projections 4 of the substrate 1, in a step of introducing impurities with the gate electrode 9 used as a mask, impurities are introduced at low concentration into parts of the semiconductor film 6, which are extended along the side surfaces of the projection 4, through the insulating film 8, so that the LDD region 12 is formed. Therefore, even when the LDD region 12 is provided, the size of an element is prevented from being increased. Thus, the present invention can also be applied to the case of a tapered shape in which the side surfaces of the projections 4 are sloping. Note that when the slopes of the side surfaces of the projections 4 are gentle, impurities which do not pass through the insulating film 8 but directly enter the semiconductor film 6 along the side surfaces are increased and thus the LDD region is not easily formed; therefore, the slopes of the side surfaces are preferably steeper (that is, almost perpendicular) for formation of the LDD region.

Figure 4A:
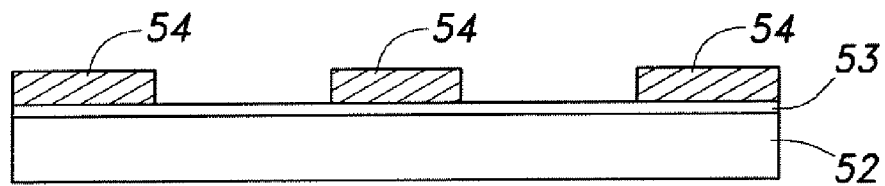
FIGS. 4A and 4B are cross-sectional views showing another embodiment of a method for forming an insulating substrate having a surface provided with a projection.
Figure 4B:
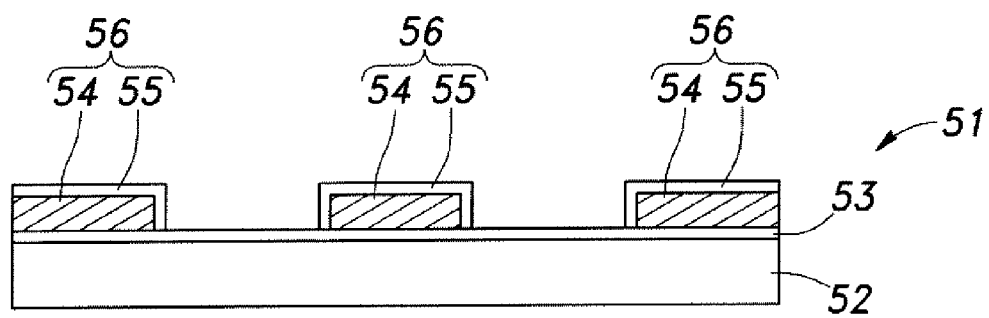

FIGS. 4A and 4B are cross-sectional views showing another method for forming an insulating substrate provided with projections.

In the case of the embodiment of FIGS. 4A and 4B, as shown in FIG. 4A, a conductive film 54 is formed over a base film 53 formed over a substrate 52 having a plane surface and then patterned by, for example, being etched so that island-like conductive films 54 which are spaced apart from each other are formed. The substrate 52 and the base film 53 are the same as the substrate 2 and the base film 3 which are shown in FIG. 1A, respectively. The conductive film 54 can be formed using an element such as tantalum (Ta), tungsten (W), titanium (Ti), molybdenum (Mo), aluminum (Al), copper (Cu), chromium (Cr), or niobium (Nb), or an alloy or compound material that contains any of such elements as its main component. Such a material may be formed as a single layer or a laminate.

Next, as shown in FIG. 4B, an insulating film 55 are formed so as to cover the islands-shaped conductive films 54, and thus an insulating substrate 51 having an insulating surface provided with projections 56 can be obtained. For the insulating film 55 for covering the conductive films 54, the similar material to that of the base film 53 (that is, the similar material to that of the base film 3 in FIG. 1A) can be used. A thickness of the insulating film 55 is approximately 1 to 10 nm, preferably from 1 to 5 nm. Note that although the insulating film 55 may be a layered film, a charge trap might occur at an interface of the layered film; therefore, the insulating film 55 is preferably a single-layer film.

Figure 4C:
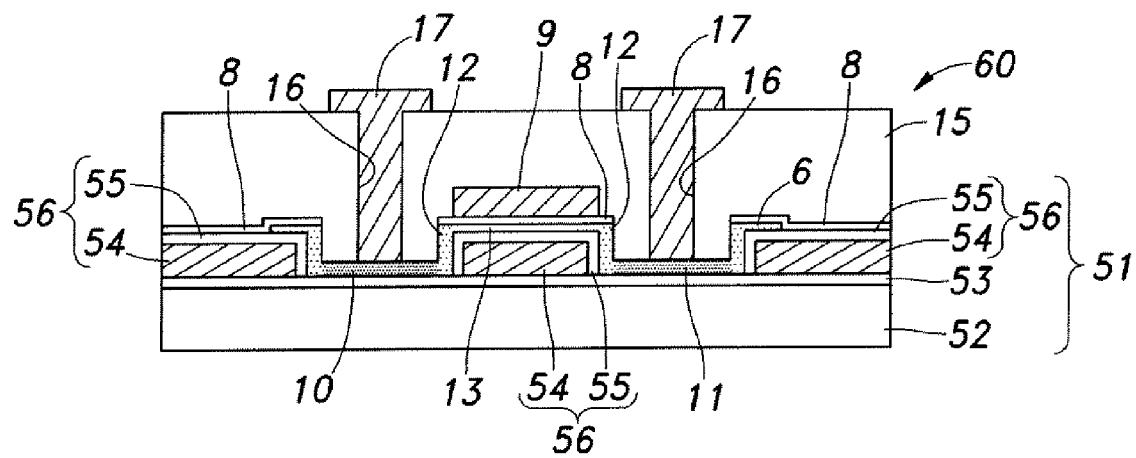
FIG. 4C is a cross-sectional view of a semiconductor device using the insulating substrate having a surface provided with a projection, which is shown in FIG. 4B.

After that, a process similar to that shown in FIGS. 1A to 1J is performed using the insulating substrate 51 provided with the projections 56, which is shown in FIG. 4B, so that a TFT 60 shown in FIG. 4C is obtained. Note that like reference numerals refer to like parts in FIG. 4C and FIG. 1J. In the TFT 60 in FIG. 4C, the conductive film 54 in each of the projections 56 functions as a bottom gate and a dual-gate structure is formed together with the gate electrode 9 over the projection 4. Thus, the dual-gate structure gives an advantageous effect the same as that obtained by reducing the thickness of the semiconductor film 6 by half, so that a subthreshold swing can be further reduced. Further, variation of a threshold voltage of the TFT 60 can be reduced and an off current can also be reduced. By reducing a subthreshold swing, the TFT 60 can be operated with a low threshold voltage. Therefore, a power source voltage is reduced with an operation speed of the TFT 60 maintained, so that power consumption can be suppressed.

Note that although the conductive film 54 is formed in each of the projections 56 in the TFT 60 of FIG. 4C, the conductive film 54 is not necessarily formed in each of the projections 56. For example, it is also possible that as in a TFT 60a shown in FIG. 5, the conductive film 54 is formed only in the projection (the central projection in this example) 56 in which the channel formation region 13 is formed in the semiconductor film 6 of a top surface and the other projections 56 are formed of an insulating material such as silicon nitride, silicon oxynitride, or silicon oxide similarly to the projection 4 in FIG. 1A and does not include the conductive film 54.

Figure 6:
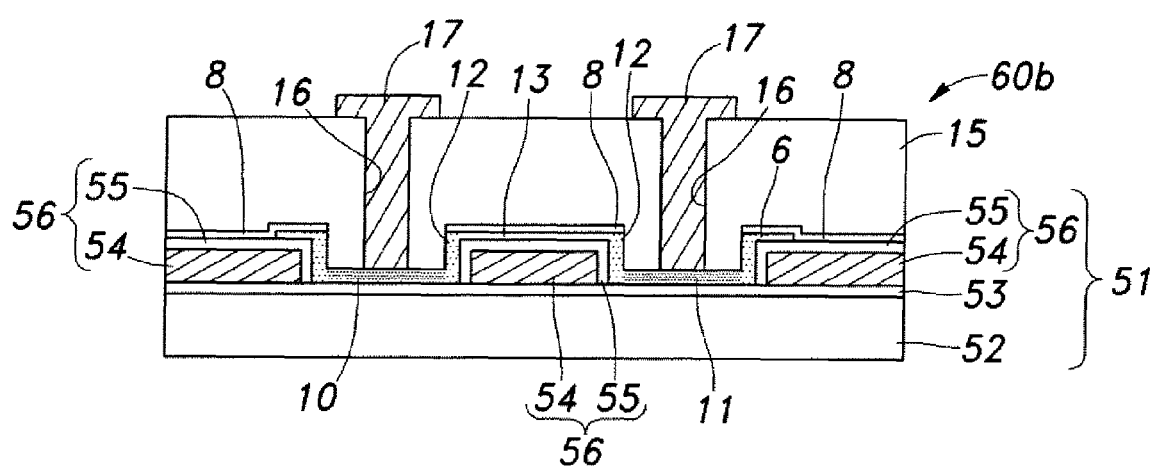
FIG. 6 is a cross-sectional view showing another embodiment of a semiconductor device according to the present invention.

By using the insulating substrate 51 provided with the conductive film 54 in the projection 56, which is shown in FIG. 4B, a so-called bottom-gate TFT which is not provided with the gate electrode 9 over the projection 56 may be formed. FIG. 6 shows such a TFT 60b having a bottom-gate structure.

Figure 7A:
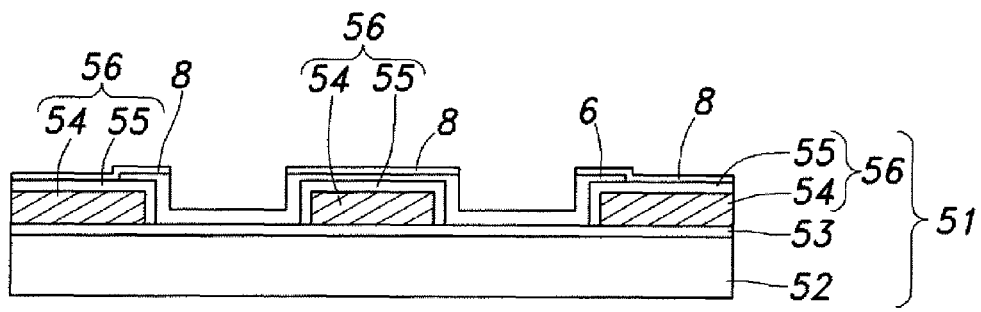
FIGS. 7A to 7F are cross-sectional views showing steps of a process for manufacturing the semiconductor device shown in FIG. 6.
Figure 7B:
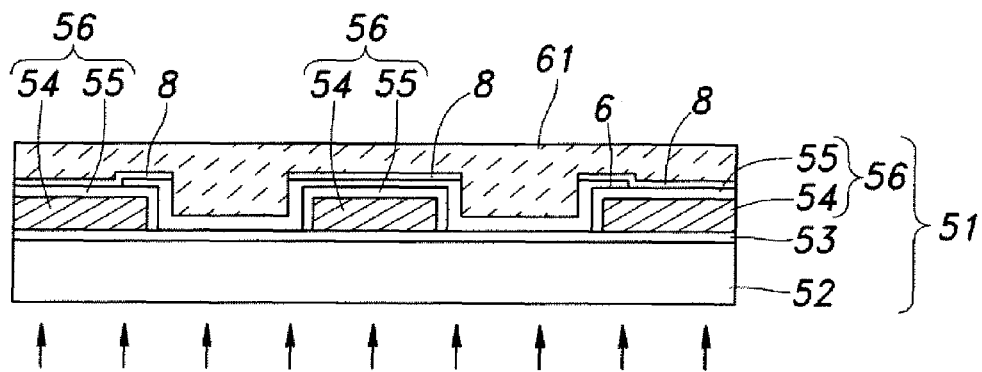
Figure 7C:
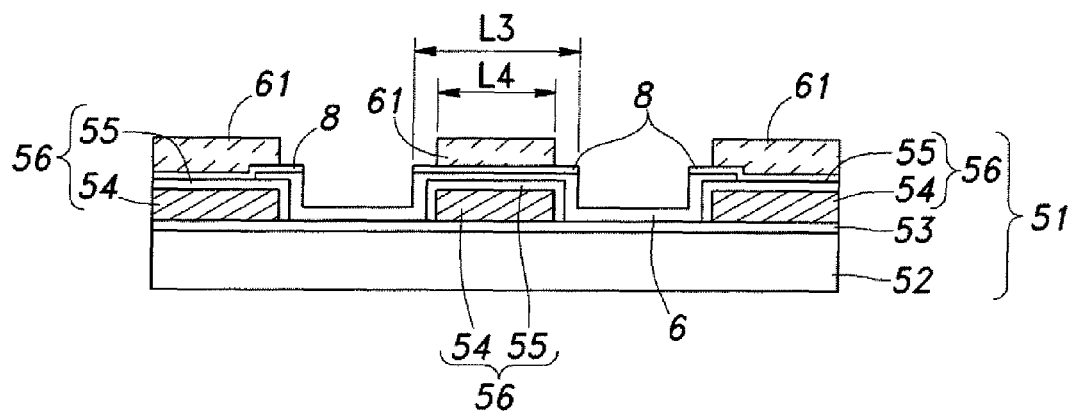
Figure 7D:
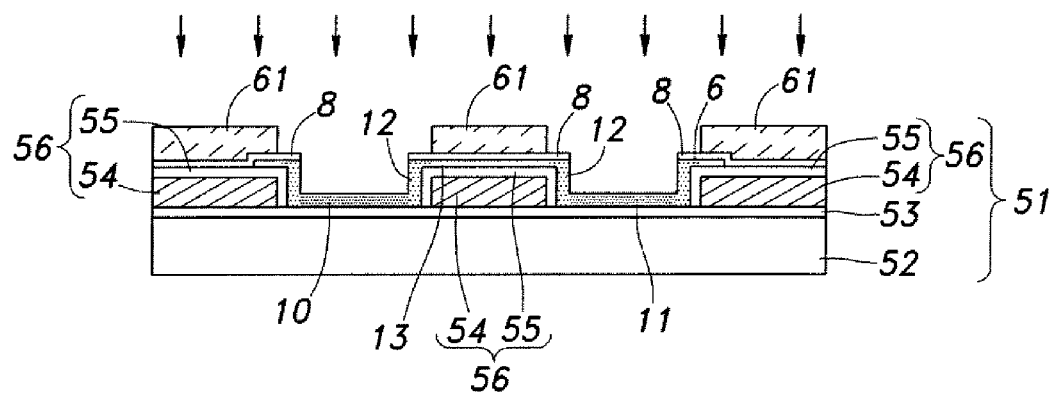
Figure 7E:
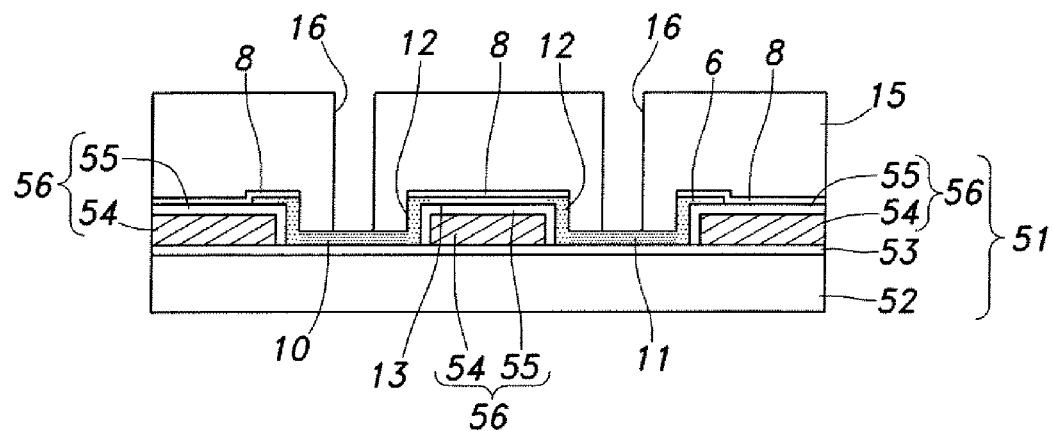
Figure 7F:
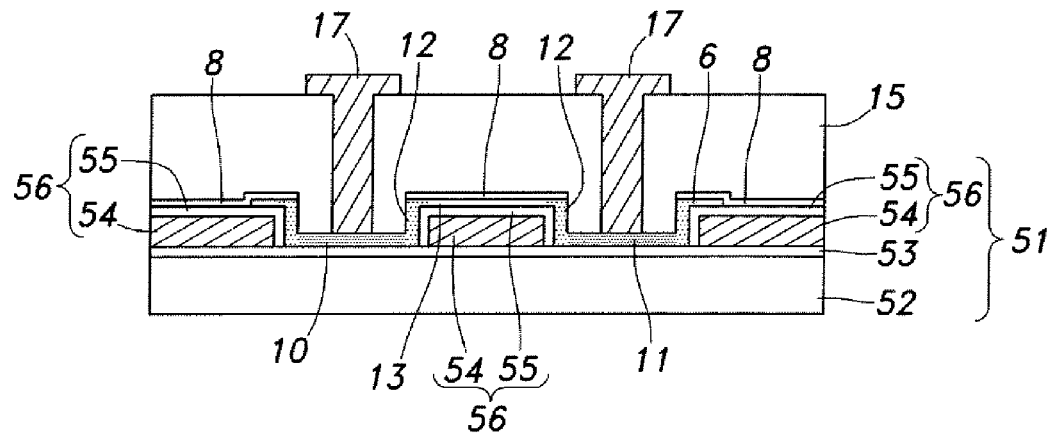

The TFT 60b in FIG. 6 is formed as follows: the island-like semiconductor film 6 is formed over the insulating substrate 51 provided with the projections 56, which is shown in FIG. 4B, through the steps of FIGS. 1B to 1F; a portion of the semiconductor film 6, which is to be a channel formation region, is thinned; and the insulating film 8 which covers the top surface of part of the thinned semiconductor film 6, which is over the projection 56, is formed (FIG. 7A). Next, as shown in FIG. 7B, a resist 61 is deposited on a surface and then patterned by rear surface light exposure in which a bottom surface is irradiated with light by using the conductive film (gate electrode) 54 in the projection 56 as a mask. Subsequently, as shown in FIG. 7C, the light-exposed portion of the resist 61 is removed so that the resist 61 is left only in a position aligned with the conductive film 54, over the insulating film 8. Owing to such rear surface light exposure, separate preparation of a mask for patterning the resist 61 can be omitted. Then, as shown in FIG. 7D, impurities are introduced into the semiconductor film 6 with the left resist 61 used as a mask to form the source region 10, the drain region 11, the LDD region 12, and the channel formation region 13. After that, within a step of FIG. 7E, the resist 61 is removed, the interlayer insulating film 15 is applied, and contact holes 16 are formed. Finally, within a step of FIG. 7F, the conductive film 17 connected to the source region 10 and the drain region 11 through the contact holes 16 is formed. The steps shown in FIGS. 7F and 7F are similar to those shown in FIGS. 1I and 1J.

By thus patterning the resist 61 by rear surface light exposure by using the conductive film (gate electrode) 54 in the projection 56 used as a mask, the resist 61 can have almost the same size as the gate electrode 54 in the projection 56 in a self-aligned manner. That is to say, a dimension L4 in the channel length direction of the resist 61 is shorter than the dimension L3 in the channel length direction of the insulating film 8 over part of the semiconductor film 6, which is over a top surface of the projection 56, by the thicknesses of the semiconductor film 6 and the insulating film 55 which covers the gate electrode 54 in the projection 56. Accordingly, in introduction of impurities with the resist 61 used as a mask, impurities are introduced into parts of the semiconductor film 6, which are extended along the side surfaces of the projection 56, through the insulating film 8 over the semiconductor film 6, so that the LDD regions 12 can be formed.

Figure 8:
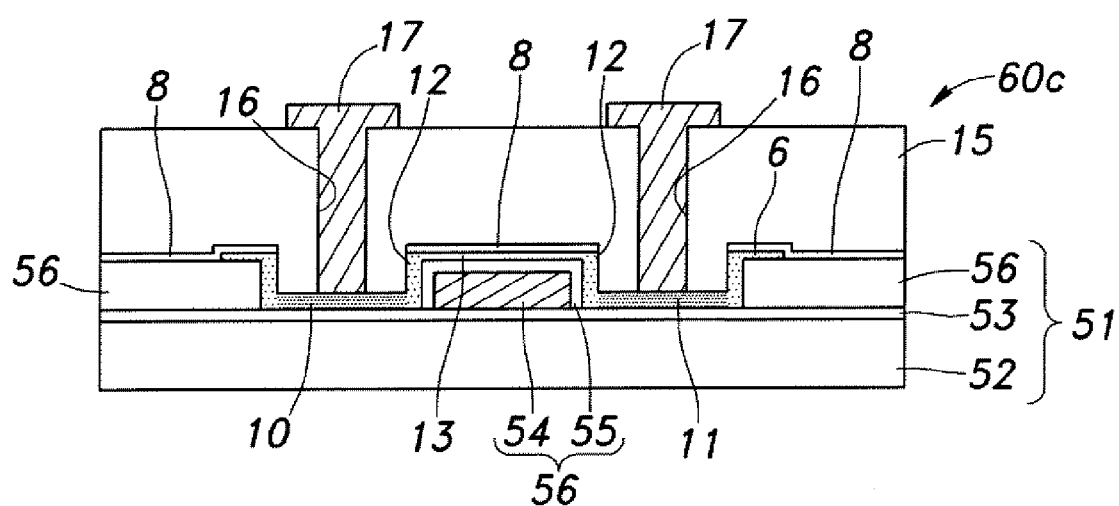
FIG. 8 is a cross-sectional view showing a modified embodiment of the semiconductor device shown in FIG. 5.

In the TFT 60b shown in FIG. 6, although the conductive film 54 is formed in each of the projections 56, the conductive film 54 is not necessarily formed in each of the projections 56. For example, it is also possible that as in a TFT 60c shown in FIG. 8, the conductive film 54 is formed only in the projection (the central projection in this example) 56 in which the channel formation region 13 is formed in the semiconductor film 6 of a top surface, and the other projections 56 are formed of an insulating material such as silicon nitride, silicon oxynitride, or silicon oxide similarly to the projection 4 in FIG. 1A and do not include the conductive film 54. The TFT 60c in FIG. 8 can also be referred to as a bottom-gate type modified embodiment of the TFT 60a in FIG. 5, in which the gate electrode 9 on an upper side is not provided in the TFT 60a in FIG. 5.

Figure 9A:
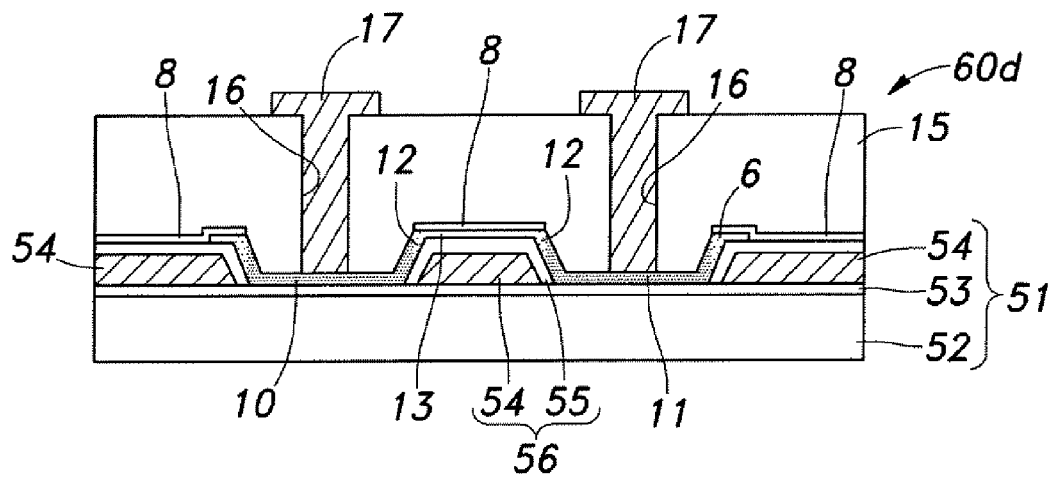
FIG. 9A is a cross-sectional view showing a modified embodiment of the semiconductor device shown in FIG. 6.

FIG. 9A is a cross-sectional view showing a modified embodiment of the TFT 60b shown in FIG. 6. A TFT 60d of FIG. 9A is different from the TFT 60b of FIG. 6 in that the projections 56 have tapered shapes in which the side surfaces are sloping. The TFT 60d of FIG. 9A can be formed through steps similar to those shown in FIGS. 4A and 4B, FIGS. 1B to 1F or FIGS. 7B to 7E except that the island-like conductive films 54 are formed so as to have tapered shapes in which the side surfaces are sloping. Note that in the case where the dimension in the channel length direction of a bottom portion of the conductive film (gate electrode) 54 in the projection 56 is approximately equal to the dimension in the channel length direction of part of the insulating film 8, which covers part of the semiconductor film 6, which is on a top surface of the projection 56, it is difficult to pattern the resist 61 which functions as a mask in introduction of impurities so as to have a dimension in a channel length direction, which is shorter than that of the insulating film 8, by rear surface light exposure shown in FIG. 7C. Therefore, in such a case, in order to make parts of the semiconductor film 6, which are extended along the side surface of the projection 56, serve as the LDD region 12, a mask for light exposure and development of the resist 61 which functions as a mask used in introduction of impurities is required to be separately prepared.

Figure 9B:
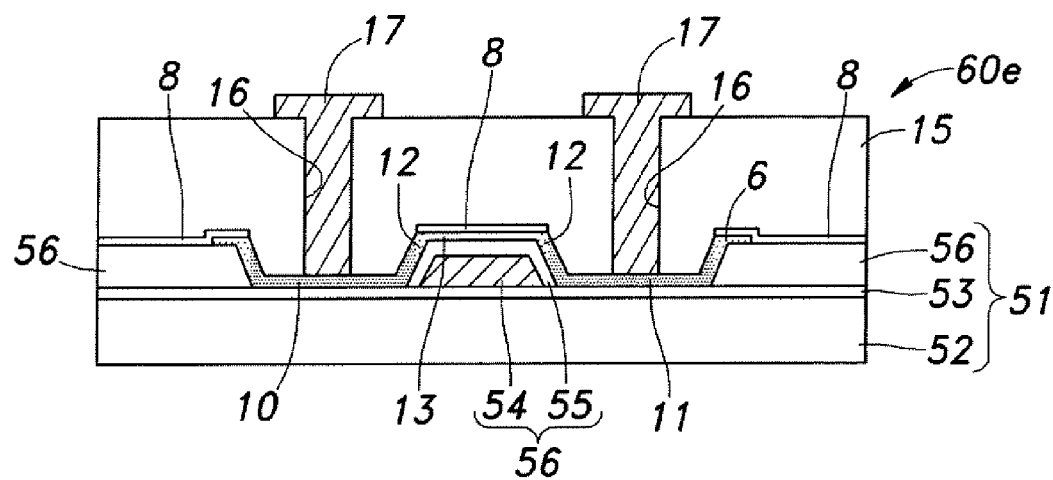
FIG. 9B is a cross-sectional view showing a modified embodiment of the semiconductor device shown in FIG. 8.

FIG. 9B is a cross-sectional view showing a modified embodiment of the TFT 60d in FIG. 9A. A TH 60e of FIG. 9B is different from the TFT 60d of FIG. 9A in that the conductive film 54 is formed only in the central projection 56 in which the channel formation region 13 is formed in the semiconductor film 6 of a top surface and the other projections 56 are formed of an insulating material such as silicon nitride, silicon oxynitride, or silicon oxide similarly to the projection 4 in FIG. 1A and do not include the conductive film 54. Note that each of the projections 56 which does not include the conductive film 54 do not necessarily have a tapered shape and may have side surfaces perpendicular to a plane surface (main surface) of the substrate 52.

Figure 5:
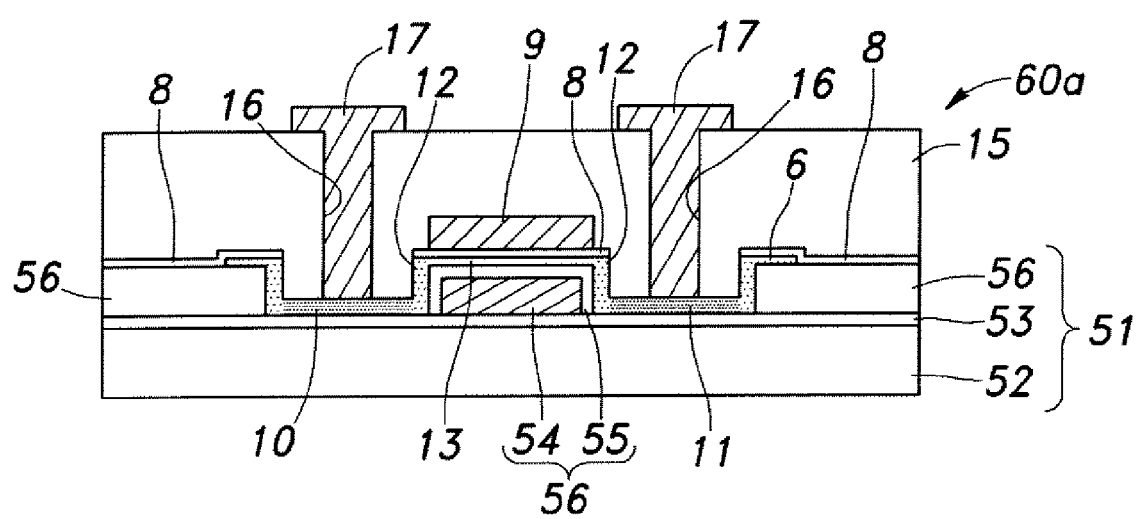
FIG. 5 is a cross-sectional view showing a modified embodiment of the semiconductor device shown in FIG. 4C.
Figure 10A:
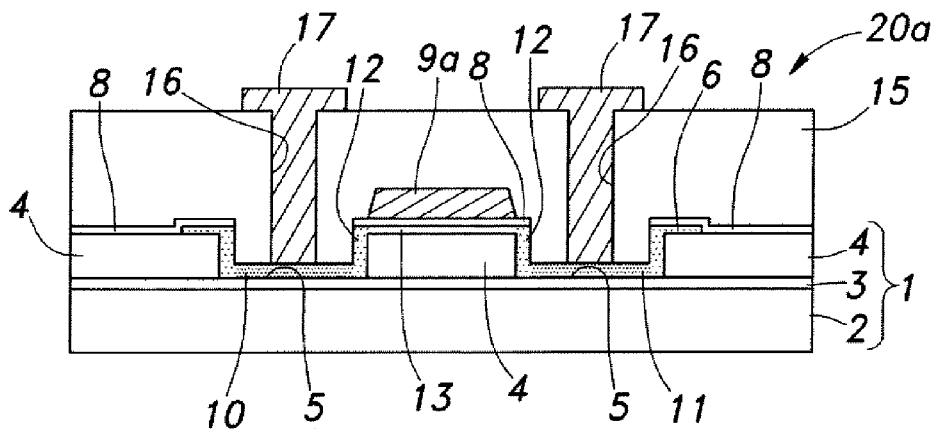
FIG. 10A is a cross-sectional view showing a modified embodiment of the semiconductor device shown in FIG. 1J.
Figure 10B:
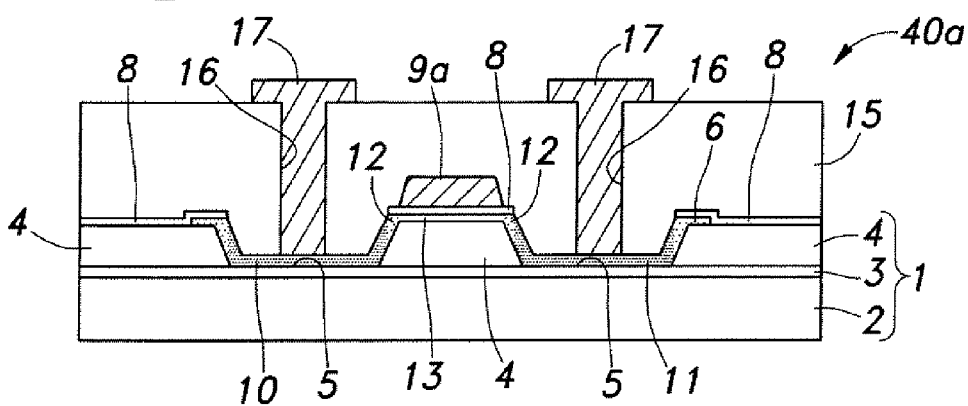
FIG. 10B is a cross-sectional view showing a modified embodiment of the semiconductor device shown in FIG. 3.
Figure 10C:
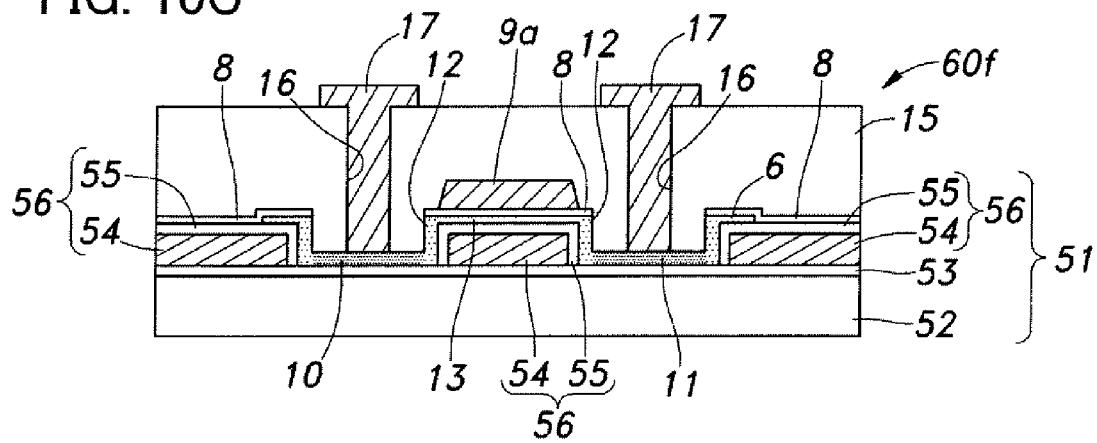
FIG. 10C is a cross-sectional view showing a modified embodiment of the semiconductor device shown in FIG. 4C.
Figure 10D:
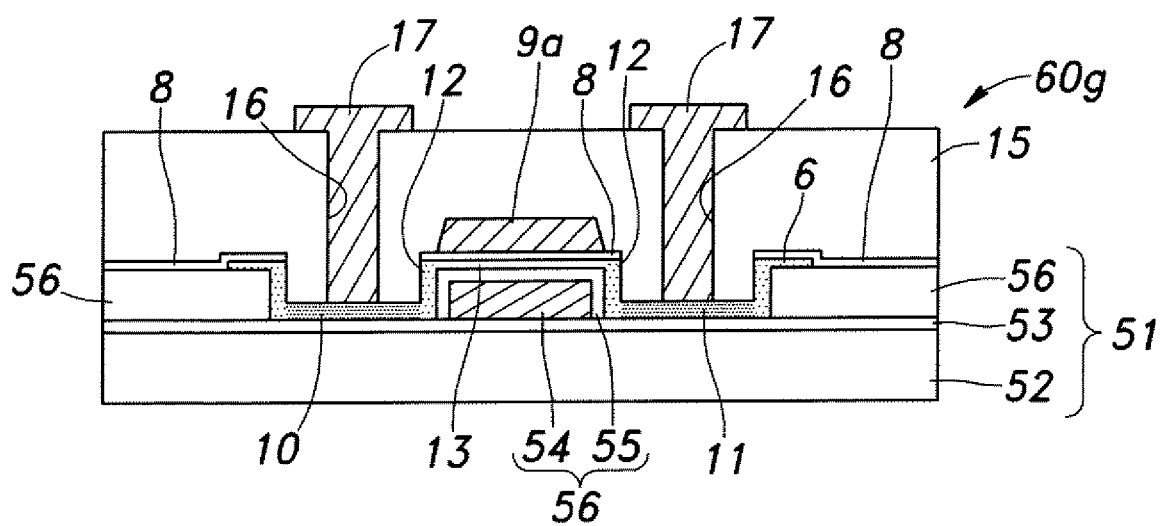
FIG. 10D is a cross-sectional view showing a modified embodiment of the semiconductor device shown in FIG. 5.

Although the TFT 20 of FIG. 1J, the TFT 40 of FIG. 3, the TFT 60 of FIG. 4C, and the TFT 60a of FIG. 5 are each provided with the gate electrode 9, such as shown, above the projections 4 or 56, the upper gate electrode 9 may also have a tapered shape in which the side surfaces are sloping. A TFT 20a of FIG. 10A, a TFT 40a of FIG. 10B, a TFT 60f of FIG. 10C, and a TFT 60g of FIG. 10D are modified embodiments of the TFT 20 of FIG. 1J, the TFT 40 of FIG. 3, the TFT 60 of FIG. 4C, and the TFT 60a of FIG. 5, respectively, and each has a gate electrode 9a having a tapered shape in which side surfaces are slanting over the central projection 4 or 56. The gate electrode 9a having a tapered shape can be formed through, for example, the step shown in FIG. 1G in which when a conductive material is formed and then etched with a patterned photoresist used as a mask, a proper etchant is used so that the side surfaces are sloping. The upper gate electrode 9a having a tapered shape has an advantage that it has better adhesiveness to an insulating film to be formed thereover.

A semiconductor device (TFT) of the present invention and a method for manufacturing the semiconductor device can be used for, for example, a pixel transistor of a liquid crystal display device, a switching TFT of a peripheral driver circuit, or any other switching TFT in a general semiconductor integrated circuit. As examples of an electronic appliance to which the present invention can be applied, a desktop display, a floor-stand display, or a wall-hung type display; a camera such as a video camera or a digital camera; a goggle display; a navigation system; an audio reproducing device (a car audio, an audio component stereo, or the like); a computer; a game machine; a portable information terminal (a mobile computer, a mobile phone, a portable game machine, an electronic book, or the like); an image reproducing device provided with a recording medium (specifically, a device for reproducing video or still images recorded in a recording medium such as a digital versatile disc (DVD) and having a display for displaying the reproduced video or still images); or the like can be given. Specific examples of these electronic appliances are shown in FIGS. 11A to 11H.

Figure 11A:
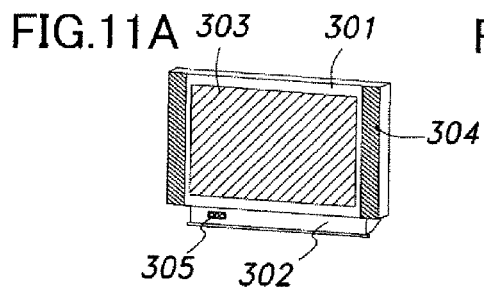
FIGS. 11A to 11H are perspective views showing electronic appliances to each of which the present invention is applied.

FIG. 11A shows a desktop display, a floor-stand display, or a wall-hung type display, which includes a housing 301, a supporting base 302, a display portion 303, a speaker portion 304, a video input terminal 305, and the like. Such a display can be used as any display device for displaying information, for example, for a personal computer, for TV broadcast reception, or for advertisement display. A semiconductor device of the present invention can be used as a pixel transistor or a switching transistor of a peripheral driver circuit of such a display, so that reduction in power consumption due to reduction in operating voltage and high reliability can be achieved without increase in size of the device.

Figure 11B:
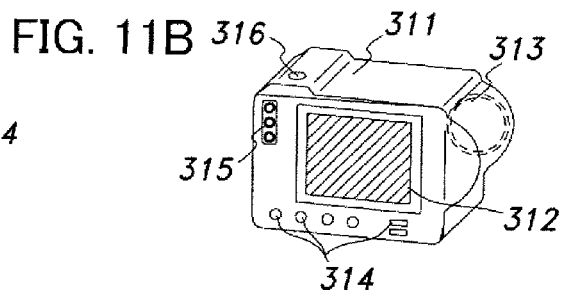

FIG. 11B shows a digital camera which includes a main body 311, a display portion 312, an image receiving portion 313, operating keys 314, an external connection port 315, a shutter button 316, and the like. A semiconductor device of the present invention can be used as a pixel transistor of a display portion or a switching transistor of a peripheral driver circuit of such a digital camera, so that reduction in power consumption due to reduction in operating voltage and high reliability can be achieved without increase in size of the device.

Figure 11C:
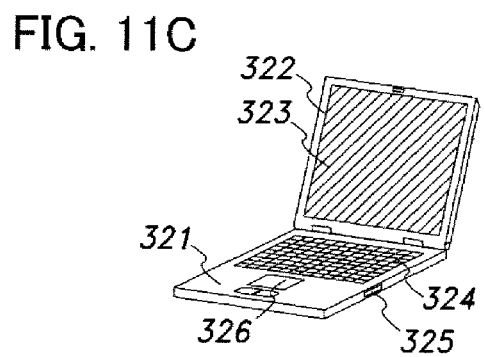

FIG. 11C shows a computer which includes a main body 321, a housing 322, a display portion 323, a keyboard 324, an external connection port 325, a pointing device 326, and the like. Note that the computer includes a so-called laptop computer on which a central processing unit (CPU), a recording medium, and the like are mounted, and a so-called desktop computer provided with them separately. A semiconductor device of the present invention can be used as a pixel transistor of a display portion or a switching transistor of a peripheral driver circuit of such a computer, so that reduction in power consumption due to reduction in operating voltage and high reliability can be achieved without increase in size of the device.

Figure 11D:
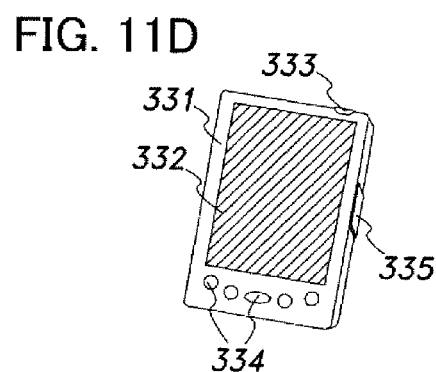

FIG. 11D shows a mobile computer which includes a main body 331, a display portion 332, a switch 333, operating keys 334, an infrared port 335, and the like. A semiconductor device of the present invention can be used as a pixel transistor of a display portion or a switching transistor of a peripheral driver circuit of such a mobile computer, so that reduction in power consumption due to reduction in operating voltage and high reliability can be achieved without increase in size of the device.

Figure 11E:
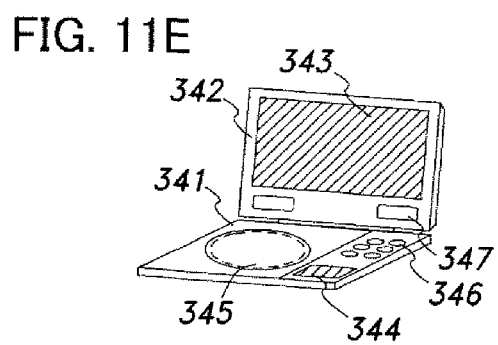

FIG. 11E shows a portable image reproducing device provided with a recording medium (specifically, a DVD reproducing device), which includes a main body 341, a housing 342, a first display portion 343, a second display portion 344, a recording medium (DVD or the like) reading portion 345, an operating key 346, a speaker portion 347, and the like. The first display portion 343 mainly displays image data and the second display portion 344 mainly displays text data. Note that the image reproducing device provided with a recording medium also includes a home-use game machine and the like. A semiconductor device of the present invention can be used as a pixel transistor of each of the first display portion and the second display portion or a switching transistor of a peripheral driver circuit of such a portable image reproducing device, so that reduction in power consumption due to reduction in operating voltage and high reliability can be achieved without increase in size of the device.

Figure 11F:
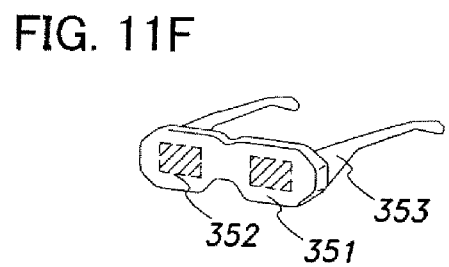

FIG. 11F shows a goggle display which includes a main body 351, a display portion 352, an arm portion 353, and the like. A semiconductor device of the present invention can be used as a pixel transistor of a display portion or a switching transistor of a peripheral driver circuit of such a goggle display, so that reduction in power consumption due to reduction in operating voltage and high reliability can be achieved without increase in size of the device.

Figure 11G:
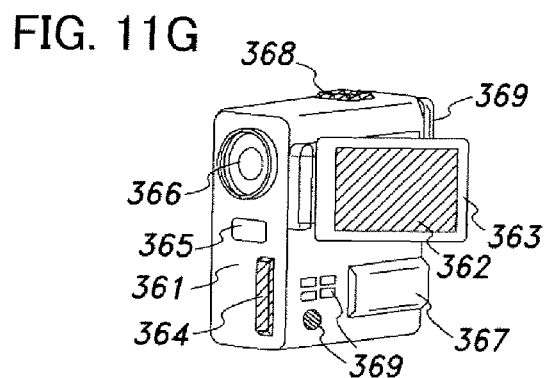

FIG. 11G shows a video camera which includes a main body 361, a display portion 362, a housing 363, an external connection port 364, a remote control receiving portion 365, an image receiving portion 366, a battery 367, an audio inputting portion 368, operation keys 369, and the like. A semiconductor device of the present invention can be used as a pixel transistor of a display portion or a switching transistor of a peripheral driver circuit of such a video camera, so that reduction in power consumption due to reduction in operating voltage and high reliability can be achieved without increase in size of the device.

Figure 11H:
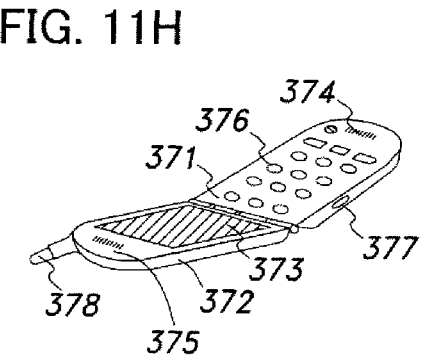

FIG. 11H shows a mobile phone which includes a main body 371, a housing 372, a display portion 373, an audio input portion 374, an audio output portion 375, an operating key 376, an external connection port 377, an antenna 378, and the like. A semiconductor device of the present invention can be used as a pixel transistor of a display portion or a switching transistor of a peripheral driver circuit of such a mobile phone, so that reduction in power consumption due to reduction in operating voltage and high reliability can be achieved without increase in size of the device.

Note that the display portions of the electronic appliances described above may be formed as a self-light-emitting type in which a light-emitting element such as an LED or an organic EL is used for each pixel, or may be formed as another type in which a light source such as a backlight is used like a liquid crystal display. In the case of a self-light-emitting type, a backlight is not required and a display portion can be thinner than a liquid crystal display.

Moreover, the above electronic appliances have been increasingly used for displaying data distributed through an electronic communication line such as the Internet and a CATV (cable television) or used as TV receptors. In particular, an opportunity for displaying moving image data is increasing. A display device of a self-light-emitting type is suitable for such a moving image display since a light-emitting material such as an organic EL material responds much faster than that of a liquid crystal. Further, it is also suitable for performing time division driving. When the luminance of a light-emitting material is increased in the future, the light-emitting material can be used for a front or rear projector by magnifying and projecting outputted light containing image data by a lens or the like.

Since a light-emitting portion of a self-light-emitting display portion consumes power, it is desirable to display data so that the light-emitting portion is as small as possible. Therefore, in the case where a display portion of a portable information terminal, in particular, of a mobile phone, an audio reproducing device, or the like which mainly displays text data is of a self-light-emitting type, it is desirable to perform driving so that a light-emitting portion displays text data while a non-light-emitting portion serves as the background.

As described above, an application range of the present invention extremely wide and the present invention can be applied to electronic appliances of various fields.

This application is based on Japanese Patent Application serial no. 2007-172646 filed with Japan Patent Office on Jun. 29, 2007, the entire contents of which are hereby incorporated by reference.

What is claimed is:

1. A method for manufacturing a semiconductor device comprising:
    forming a substrate having a surface provided with a projection;
    forming a semiconductor film, having a thickness smaller than a height of the projection, over the surface of the substrate provided with the projection;
    forming a resist over a part of the semiconductor film that covers the projection and regions of the substrate adjacent to both sides of the projection;
    etching the semiconductor film with the resist used as a mask to form an island-like semiconductor film that covers the projection and the regions of the substrate adjacent to both sides of the projection;
    etching the resist to expose a part of the island-like semiconductor film that covers a top surface of the projection, wherein parts of the island-like semiconductor film located over the regions of the substrate adjacent to both sides of the projection remain covered with the resist;
    etching the exposed part of the island-like semiconductor film that covers the top surface of the projection to thin the exposed part of the island-like semiconductor film;
    removing the resist after etching the exposed part of the island-like semiconductor film;
    introducing impurities to portions of the island-like semiconductor film to form a source region and a drain region with a channel formation region formed therebetween, the channel formation region being located over the projection.

2. The method for manufacturing a semiconductor device according to claim 1, after the step of thinning the exposed part of the island-like semiconductor film that covers the top surface of the projection further comprising:
    forming an insulating film covering at least the thinned part of the island-like semiconductor film; and
    forming a second resist over the insulating film, wherein the impurities are introduced using the second resist over the insulating film as a mask.

3. The method for manufacturing a semiconductor device according to claim 2, wherein a thickness of the insulating film and a width of the second resist are set so that the impurities are introduced to at least portions of the island-like semiconductor film formed along side surfaces of the projection through the insulating film.

4. The method for manufacturing a semiconductor device according to claim 1, wherein the semiconductor film is a crystalline semiconductor film.

5. The method for manufacturing a semiconductor device according to claim 1, wherein a base film is formed over the surface of the substrate, and interposed between the substrate and the projection.

6. A method for manufacturing a semiconductor device comprising:
   forming a substrate having a surface provided with a projection;
   forming a semiconductor film, having a thickness smaller than a height of the projection, over the surface of the substrate provided with the projection;
   forming a resist over a part of the semiconductor film that covers the projection and regions of the substrate adjacent to both sides of the projection;
   etching the semiconductor film with the resist used as a mask to form an island-like semiconductor film that covers the projection and the regions of the substrate adjacent to both sides of the projection;
   etching the resist to expose a part of the island-like semiconductor film that covers a top surface of the projection, wherein parts of the island-like semiconductor film located over the regions of the substrate adjacent to both sides of the projection remain covered with the resist;
   etching the exposed part of the island-like semiconductor film that covers the top surface of the projection to thin the exposed part of the island-like semiconductor film;
   removing the resist after etching the exposed part of the island-like semiconductor film;
   introducing impurities to portions of the island-like semiconductor film to form a source region and a drain region with a channel formation region formed therebetween, the channel formation region being located over the projection;
   forming an insulating film covering at least the thinned island-like semiconductor film that covers the top surface of the projection of the island-like semiconductor film; and
   forming a gate electrode over the projection with the insulating film interposed therebetween.

7. The method for manufacturing a semiconductor device according to claim 6, wherein the gate electrode is used as a mask in the step of introducing the impurities to portions of the island-like semiconductor film.

8. The method for manufacturing a semiconductor device according to claim 7, wherein a thickness of the insulating film and a width of the gate electrode are preferably set so that the impurities are introduced to at least portions of the island-like semiconductor film formed along side surfaces of the projection through the insulating film.

9. The method for manufacturing a semiconductor device according to claim 6, wherein the semiconductor film is a crystalline semiconductor film.

10. The method for manufacturing a semiconductor device according to claim 6, wherein a base film is formed over the surface of the substrate, and interposed between the substrate and the projection.

11. A method for manufacturing a semiconductor device comprising:
   forming a substrate having a surface provided with a projection, wherein the projection is formed of a gate electrode with a first insulating film that covers the gate electrode;
   forming a semiconductor film, having a thickness smaller than a height of the projection, over the surface of the substrate provided with the projection;
   forming a resist over a part of the semiconductor film that covers the projection and regions of the substrate adjacent to both sides of the projection;
   etching the semiconductor film with the resist used as a mask to form an island-like semiconductor film that covers the projection and the regions of the substrate adjacent to both sides of the projection;
   etching the resist to expose a part of the island-like semiconductor film that covers a top surface of the projection, wherein parts of the island-like semiconductor film located over the regions of the substrate adjacent to both sides of the projection remain covered with the resist;
   etching the exposed part of the island-like semiconductor film that covers the top surface of the projection to thin the exposed part of the island-like semiconductor film;
   removing the resist after etching the exposed part of the island-like semiconductor film;
   introducing impurities to portions of the island-like semiconductor film to form a source region and a drain region with a channel formation region formed therebetween, the channel formation region being located over the projection;
   forming a second insulating film covering at least the thinned island-like semiconductor film that covers the top surface of the projection of the island-like semiconductor film.

12. The method for manufacturing a semiconductor device according to claim 11, after the step of thinning the exposed part of the island-like semiconductor film that covers the top surface of the projection further comprising:
   forming a second resist over the second insulating film, wherein the impurities are introduced using the second resist over the second insulating film as a mask.

13. The method for manufacturing a semiconductor device according to claim 12, wherein a thickness of the second insulating film and a width of the second resist are set so that the impurities are introduced to at least portions of the island-like semiconductor film formed along side surfaces of the projection through the second insulating film.

14. The method for manufacturing a semiconductor device according to claim 12, wherein the step of forming the second resist over the second insulating film includes performing rear surface light exposure to the second resist formed over the second insulating film using the gate electrode as a mask, and removing portions of the second resist exposed to the light.

15. The method for manufacturing a semiconductor device according to claim 11, wherein the semiconductor film is a crystalline semiconductor film.

16. The method for manufacturing a semiconductor device according to claim 11, wherein a base film is formed over the surface of the substrate, and interposed between the substrate and the projection.

17. A method for manufacturing a semiconductor device comprising:
   forming a substrate having a surface provided with a projection, wherein the projection is formed of a first gate electrode with a first insulating film that covers the first gate electrode;

forming a semiconductor film, having a thickness smaller than a height of the projection, over the surface of the substrate provided with the projection;

forming a resist over a part of the semiconductor film that covers the projection and regions of the substrate adjacent to both sides of the projection;

etching the semiconductor film with the resist used as a mask to form an island-like semiconductor film that covers the projection and the regions of the substrate adjacent to both sides of the projection;

etching the resist to expose a part of the island-like semiconductor film that covers a top surface of the projection, wherein parts of the island-like semiconductor film located over the regions of the substrate adjacent to both sides of the projection remain covered with the resist;

etching the exposed part of the island-like semiconductor film that covers the top surface of the projection to thin the exposed part of the island-like semiconductor film;

removing the resist after etching the exposed part of the island-like semiconductor film;

introducing impurities to the portions of the island-like semiconductor film to form a source region and a drain region with a channel formation region formed therebetween, the channel formation region being located over the projection;

forming a second insulating film covering at least the thinned island-like semiconductor film that covers the top surface of the projection of the island-like semiconductor film;

forming a second gate electrode over the projection with the second insulating film interposed therebetween.

18. The method for manufacturing a semiconductor device according to claim 17, wherein the second gate electrode is used as a mask in the step of introducing the impurities to portions of the island-like semiconductor film.

19. The method for manufacturing a semiconductor device according to claim 18, wherein a thickness of the second insulating film and a width of the second gate electrode are set so that the impurities are introduced to at least portions of the island-like semiconductor film formed along side surfaces of the projection through the insulating film.

20. The method for manufacturing a semiconductor device according to claim 17, wherein the semiconductor film is a crystalline semiconductor film.

21. The method for manufacturing a semiconductor device according to claim 17, wherein a base film is formed over the surface of the substrate, and interposed between the substrate and the projection.

* * * * *